(12) United States Patent
Lin et al.

(10) Patent No.: US 12,327,792 B2
(45) Date of Patent: Jun. 10, 2025

(54) SEMICONDUCTOR STRUCTURE AND MANUFACTURING METHODS THEREOF

(71) Applicant: Taiwan Semiconductor Manufacturing Company, Ltd., Hsinchu (TW)

(72) Inventors: Bo-Jiun Lin, Hsinchu County (TW); Tung-Ying Lee, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 528 days.

(21) Appl. No.: 17/580,648

(22) Filed: Jan. 21, 2022

(65) Prior Publication Data

US 2022/0415817 A1 Dec. 29, 2022

Related U.S. Application Data

(60) Provisional application No. 63/214,749, filed on Jun. 24, 2021.

(51) Int. Cl.
*H01L 23/532* (2006.01)
*H01L 21/768* (2006.01)
*H01L 23/522* (2006.01)

(52) U.S. Cl.
CPC .... *H01L 23/53223* (2013.01); *H01L 21/7685* (2013.01); *H01L 21/76864* (2013.01); *H01L 23/5226* (2013.01); *H01L 23/53238* (2013.01); *H01L 21/76846* (2013.01)

(58) Field of Classification Search
CPC ........... H01L 23/53223; H01L 21/7685; H01L 21/76864; H01L 23/5226; H01L 23/53238; H01L 21/76846; H01L 21/76804; H01L 21/76849; H01L 21/76811
See application file for complete search history.

(56) References Cited

U.S. PATENT DOCUMENTS

| | | | |
|---|---|---|---|
| 11,062,995 B2 * | 7/2021 | Naylor | H01L 21/02614 |
| 2008/0286966 A1 * | 11/2008 | Hohage | H01L 21/02167 438/653 |
| 2018/0108610 A1 * | 4/2018 | Yang | H01L 21/7684 |
| 2021/0091010 A1 * | 3/2021 | Yang | H01L 21/76864 |
| 2021/0111129 A1 * | 4/2021 | Naylor | H01L 21/76843 |

* cited by examiner

*Primary Examiner* — J. E. Schoenholtz
(74) *Attorney, Agent, or Firm* — JCIPRNET

(57) ABSTRACT

A semiconductor structure includes a substrate and an interconnect. The substrate has a semiconductor device. The interconnect is disposed over the substrate and electrically coupled to the semiconductor device, and includes a metallization layer and a capping layer. The metallization layer is disposed over the substrate and includes a via portion and a line portion connecting to the via portion. The capping layer covers the line portion, where the line portion is sandwiched between the via portion and the capping layer, and the capping layer includes a plurality of sub-layers.

20 Claims, 23 Drawing Sheets

SEMICONDUCTOR STRUCTURE AND MANUFACTURING METHODS THEREOF

CROSS-REFERENCE TO RELATED APPLICATION

This application claims the priority benefit of U.S. provisional application Ser. No. 63/214,749, filed on Jun. 24, 2021. The entirety of the above-mentioned patent application is hereby incorporated by reference herein and made a part of this specification.

BACKGROUND

Developments in shrinking sizes of semiconductor devices and electronic components such as integrated circuits (ICs) make the integration of more devices and components into a given volume possible and lead to high integration density of various semiconductor devices and/or electronic components. Semiconductor processing for fabrications of the semiconductor devices and ICs continues to evolve towards increasing device-density, higher numbers of active devices (mainly transistors) of ever decreasing device dimensions. The resistance performance of the interconnect and/or redistribution layer has become particularly challenging because of the abovenamed increase in the device density.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
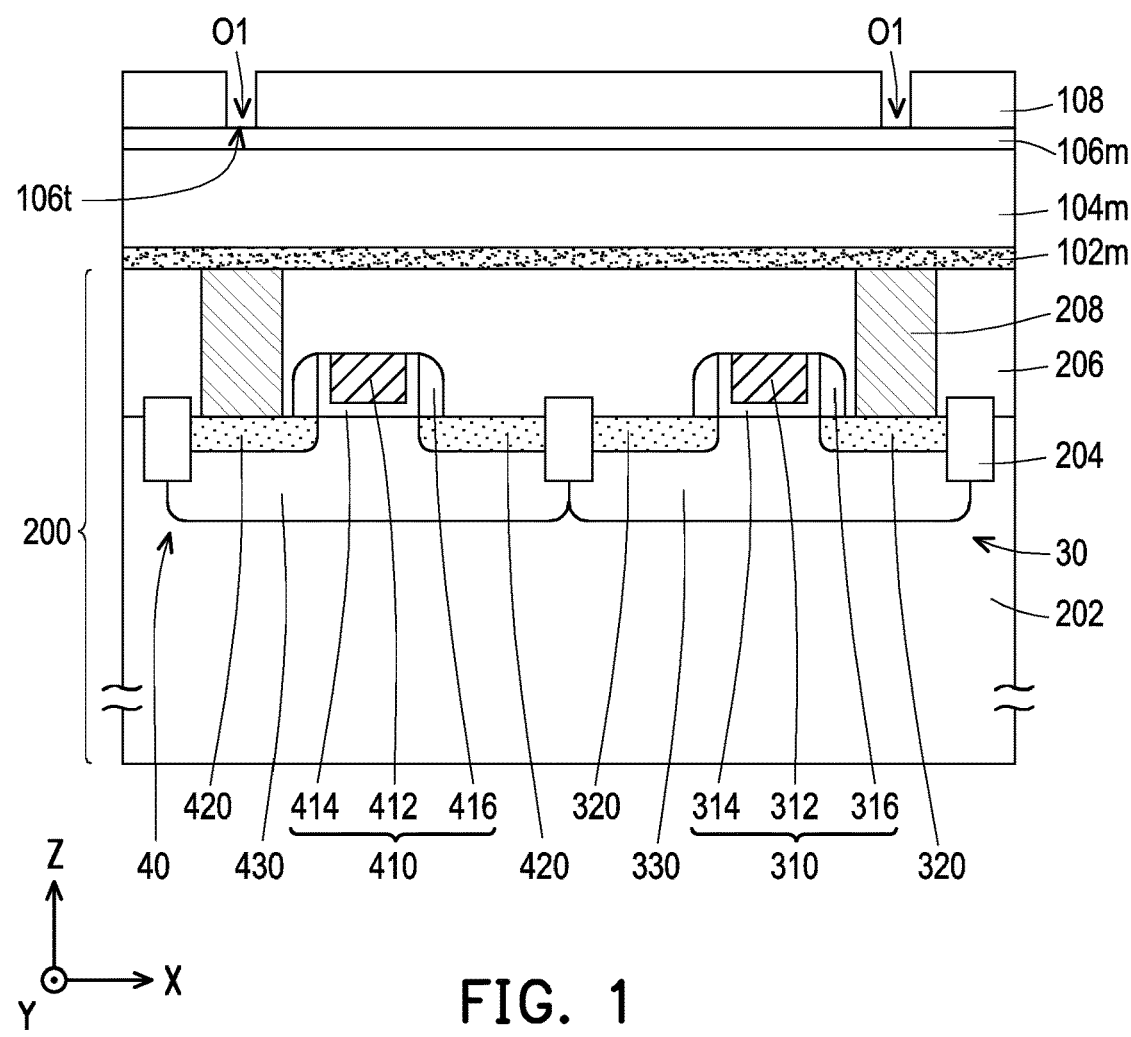
FIG. 1, FIG. 2, FIG. 3, FIG. 4, FIG. 5, FIG. 6, FIG. 7, FIG. 8, FIG. 9, FIG. 11, and FIG. 12 are schematic cross-sectional views showing a method of manufacturing a semiconductor structure in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second" and the like, may be used herein for ease of description to describe similar or different element(s) or feature(s) as illustrated in the figures, and may be used interchangeably depending on the order of the presence or the contexts of the description.

It should be appreciated that the following embodiment(s) of the disclosure provides applicable concepts that can be embodied in a wide variety of specific contexts. The specific embodiment(s) discussed herein is merely illustrative and is related to a semiconductor structure including an interconnect with a capping layer disposed over a metallization pattern thereof for suppressing surface scattering effect, and is not intended to limit the scope of the disclosure. In accordance with some embodiments, a capping layer is disposed on a surface of a metallization pattern inside an interconnect of the semiconductor structure, where the capping layer is able to suppress the surface scattering effect of the metallization pattern (e.g. made of Cu) so to reduce the resistivity of the Cu metallization pattern, thereby improving the performance of the semiconductor structure. In the case, the capping layer is a two-dimensional material of a layered structure. In accordance with some alternative embodiments, an additional capping layer is disposed on a sidewall of the Cu metallization pattern to suppress the surface scattering effect, thereby further reducing the resistivity of the Cu metallization pattern and improving the electric performance. In addition, with such additional capping layer, a barrier layer and/or a liner disposed between the Cu metallization pattern and a dielectric structure/layer inside the interconnect can be omitted, thus that an overall volume of the Cu metallization pattern is increased, which also further reduced the resistivity of the Cu metallization pattern.

The semiconductor structure illustrated in the following embodiments may be applied to a semiconductor die or chip (such as a system-on-a-chip (SoC), a system-on-integrated-chip (SoIC), or the like) for illustrative purposes only, and is not intended to limit the scope of the disclosure. FIG. 1, FIG. 2, FIG. 3, FIG. 4, FIG. 5, FIG. 6, FIG. 7, FIG. 8, FIG. 9, FIG. 11, and FIG. 12 are schematic cross-sectional views showing a method of manufacturing a semiconductor structure in accordance with some embodiments of the disclosure.

Figure 12:
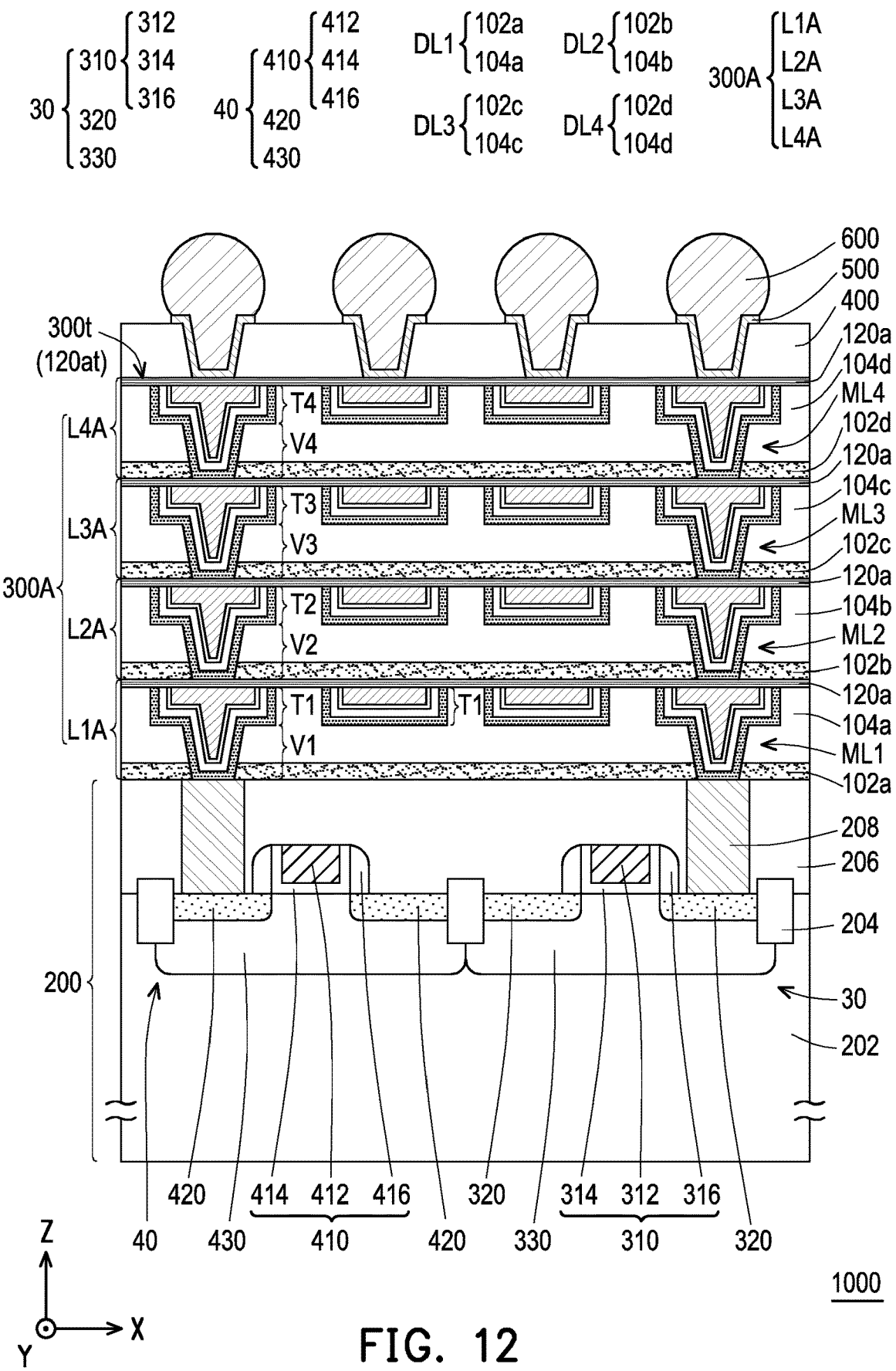

Referring to FIG. 1, in some embodiments, a method of forming a semiconductor structure 1000 (as shown in FIG. 12) includes following steps. First, an initial structure illustrated in FIG. 1 is provided. The initial structure includes a substrate 200 and a stack structure disposed on the substrate 200, and a patterned resist layer 108 disposed on the stack structure, for example. As shown in FIG. 1, the stack structure may be sandwiched between the patterned resist layer 108 and the substrate 200.

In some embodiments, as shown in FIG. 1, the substrate 200 includes a wide variety of devices (also referred to as semiconductor devices) formed in a semiconductor substrate 202. The devices may include active components, passive components, or a combination thereof. The devices may include integrated circuits devices. The devices may include transistors, capacitors, resistors, diodes, photodiodes, fuse devices, or other similar devices. The functions of the devices may include memory, processors, sensors, amplifiers, power distribution, input/output circuitry, or the like.

For example, the semiconductor substrate 202 includes a bulk semiconductor, a crystalline silicon substrate, a doped semiconductor substrate (e.g., p-type semiconductor substrate or n-type semiconductor substrate), a semiconductor-on-insulator (SOI) substrate, or the like. In certain embodiments, the semiconductor substrate 202 includes one or more doped regions or various types of doped regions, depending on design requirements. In some embodiments, the doped regions are doped with p-type and/or n-type dopants. For example, the p-type dopants are boron or $BF_2$ and the n-type dopants are phosphorus or arsenic. The doped regions may be configured for an n-type metal-oxide-semiconductor (NMOS) transistor or a p-type MOS (PMOS) transistor. The substrate 200 may be a wafer, such as a silicon wafer. Generally, the SOI substrate is a layer of a semiconductor material formed on an insulator layer. The insulator layer is, for example, a buried oxide (BOX) layer, a silicon oxide layer, or the like. Other substrates, such as a multi-layered or gradient substrate may also be used. In some alternative embodiments, the semiconductor substrate 202 includes a semiconductor substrate made of other suitable elemental semiconductor, such as diamond or germanium; a suitable compound semiconductor, such as gallium arsenide, silicon carbide, gallium phosphide, indium phosphide, indium arsenide and indium antimonide, an alloy semiconductor such as SiGe, GaAsP, AlInAs, AlGaAs, GaInAs, GaInP and GaInAsP or combinations thereof.

As shown in FIG. 1, the devices such as a PMOS transistor 30 and a NMOS transistor 40 may be formed in the semiconductor substrate 202. In some embodiments, more than one isolation structures 204 are formed in the semiconductor substrate 202 for separating the PMOS transistor 30 and the NMOS transistor 40. In certain embodiments, the isolation structures 204 are trench isolation structures. In other embodiments, the isolation structures 204 includes local oxidation of silicon (LOCOS) structures. In some embodiments, the insulator material of the isolation structures 204 includes silicon oxide, silicon nitride, silicon oxynitride, a spin-on dielectric material, or a low-k dielectric material. For example, the low-k dielectric material generally having a dielectric constant lower than 3.9. In one embodiment, the insulator material may be formed by chemical vapor deposition (CVD) such as high-density plasma CVD (HDP-CVD) and sub-atmospheric CVD (SACVD) or formed by spin-on. In certain embodiments, the devices (such as the PMOS transistor 30 and the NMOS transistor 40) and the isolation structures 204 are formed in the substrate 200 during the front-end-of-line (FEOL) processes. In one embodiment, the PMOS transistor 30 and the NMOS transistor 40 are formed following the complementary MOS (CMOS) processes. The number and configurations of the devices formed in the semiconductor substrate 202 should not be limited by the embodiments or drawings of this disclosure. It is understood that the number and configurations of the devices may have different material or configurations depending on product designs.

In some embodiments, the PMOS transistor 30 includes a gate structure 310 and source/drain regions 320 located at two opposite sides of the gate structure 310, where the gate structure 310 is formed on an n-well region 330, and the source/drain regions 320 are formed in the n-well region 330. In one embodiment, the gate structure 310 includes a gate electrode 312, a gate dielectric layer 314 and a gate spacer 316. The gate dielectric layer 314 may spread between the gate electrode 312 and the semiconductor substrate 202, and may or may not further cover a sidewall of the gate electrode 312. The gate spacer 316 may laterally surround the gate electrode 312 and the gate dielectric layer 314. In one embodiment, the source/drain regions 320 include doped regions of p-type dopant that are formed in the n-well region 330 by ion implantation. In an alternative embodiment, the source/drain regions 320 include epitaxial structures formed in and protruding from a surface of the semiconductor substrate 202, that are formed by epitaxial growth.

In some embodiments, the NMOS transistor 40 includes a gate structure 410 and source/drain regions 420 located at two opposite sides of the gate structure 410, where the gate structure 410 is formed on an p-well region 430, and the source/drain regions 420 are formed in the p-well region 430. In one embodiment, the gate structure 410 includes a gate electrode 412, a gate dielectric layer 414 and a gate spacer 416. The gate dielectric layer 414 may spread between the gate electrode 412 and the substrate 202, and may or may not further cover a sidewall of the gate electrode 412. The gate spacer 416 may laterally surround the gate electrode 412 and the gate dielectric layer 414. In one embodiment, the source/drain regions 420 include doped regions of n-type dopant that are formed in the p-well region 430 by ion implantation. In an alternative embodiment, the source/drain regions 420 include epitaxial structures formed in and protruding from a surface of the substrate 202, that are formed by epitaxial growth.

As illustrated in FIG. 1, for example, the substrate 200 further includes a dielectric layer 206 stacked on the semiconductor substrate 202 and a plurality of contact plugs 208 penetrating through the dielectric layer 206 to electrically connect to the PMOS transistor 30 and the NMOS transistor 40. In certain embodiments, the dielectric layer 206 and the contact plugs 208 are also formed in the structure 200 during the FEOL processes. The dielectric layer 206 may laterally surround the gate structures 310, 410 and cover the source/drain regions 320, 420 for providing protections to the devices formed in/on the substrate 202. Some of the contact plugs 208 may penetrate through the dielectric layer 206 in order to establish electrical connection with the source/drain regions 320, 420, while others of the contact plugs 208 (not shown) may penetrate through the dielectric layer 206 to establish electrical connection with the gate electrodes (e.g. the gate electrodes 312, 412) of the gate structures 310, 410, in order to provide terminals for electrical connections to later-formed components (e.g. an interconnect or interconnect structure) or external components.

The dielectric layer 206 may be referred to as an interlayer dielectric (ILD) layer, while the contact plugs 208 may be referred to as metal contacts or metallic contacts. For example, the contact plugs 208 electrically connected to the source/drain regions 320, 420 are referred to as source/drain contacts, and the contact plugs 208 electrically connected to the gate electrodes 312, 412 are referred to as gate contacts. In some embodiments, the contact plugs 208 may include copper (Cu), copper alloys, nickel (Ni), aluminum (Al), manganese (Mn), magnesium (Mg), silver (Ag), gold (Au), tungsten (W), a combination of thereof, or the like. The contact plugs 208 may be formed by, for example, plating such as electroplating or electroless plating, CVD such as plasma enhanced CVD (PECVD), atomic layer deposition (ALD), and physical vapor deposition (PVD), a combination thereof, or the like. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

In some embodiments, the dielectric layer 206 includes silicon oxide, silicon nitride, silicon carbide, silicon oxynitride, silicon carbonitride, silicon carbide oxynitride, spin-on glass (SOG), phosphosilicate glass (PSG), borosilicate glass (BSG), borophosphosilicate glass (BPSG), fluorinated silica glass (FSG), carbon doped silicon oxide (e.g., SiCOH), polyimide, and/or a combination thereof. In alternative embodiments, the dielectric layer 206 include low-k dielectric materials. For example, the low-k dielectric material generally having a dielectric constant lower than 3.9. Examples of low-k dielectric materials may include BLACK DIAMOND® (Applied Materials of Santa Clara, Calif.), Xerogel, Aerogel, amorphous fluorinated carbon, Parylene, BCB, Flare, SILK® (Dow Chemical, Midland, Mich.), hydrogen silsesquioxane (HSQ) or fluorinated silicon oxide (SiOF), and/or a combination thereof. It is understood that the dielectric layer 206 may include one or more dielectric materials. For example, the dielectric layer 206 include a single-layer structure or a multilayer structure. In some embodiments, the dielectric layer 206 is formed to a suitable thickness by CVD such as flowable chemical vapor deposition (FCVD), HDP-CVD, and SACVD, spin-on, sputtering, or other suitable methods.

A seed layer (not shown) may be optionally formed between the dielectric layer 206 and the contact plugs 208. That is, for example, the seed layer covers a bottom surface and sidewalls of the contact plugs 208. In some embodiments, the seed layer is a metal layer, which may be a single layer or a composite layer comprising a plurality of sub-layers formed of different materials. In some embodiments, the contact plugs 208 includes copper layer and the seed layer includes a titanium layer and a copper layer over the titanium layer. The seed layer is formed using, for example, PVD or the like. In one embodiment, the seed layer may be omitted.

In addition, an additional barrier layer or adhesive layer (not shown) may be optionally formed between the contact plugs 208 and the dielectric layer 206. Owing to the additional barrier layer or adhesive layer, it is able to prevent the seed layer and/or the contact plugs 208 from diffusing to the underlying layers and/or the surrounding layers. The additional barrier layer or adhesive layer may include Ti, TiN, Ta, TaN, a combination thereof, a multilayer thereof, or the like, and may be formed using CVD, ALD, PVD, a combination thereof, or the like. In an alternative embodiment of which the seed layer is included, the additional barrier layer or adhesive layer is interposed between the dielectric layer 206 and the seed layer, and the seed layer is interposed between the contact plugs 208 and the additional barrier layer or adhesive layer. In one embodiment, the additional barrier layer or adhesive layer may be omitted.

For example, the stack structure is disposed on an illustrated top surface of the substrate 200. As shown in FIG. 1, the stack structure may include a first dielectric material layer 102*m*, a second dielectric material layer 104*m*, and a hard mask material layer 106*m*, as shown in FIG. 1. The stack structure may be referred to as a stack of multiple material layers, where more or less material layers may be included in the stack structure based on the design requirement and demand, the disclosure is not limited thereto.

As shown in FIG. 1, the first dielectric material layer 102*m* and the second dielectric material layer 104*m* may be sequentially stacked on the substrate 200 to cover the PMOS transistor 30 and the NMOS transistor 40. For example, the first dielectric material layer 102*m* is disposed on (e.g. in contact with) illustrated top surfaces of the contact plugs 208 and the dielectric layer 206, and the second dielectric material layer 104*m* is disposed on (e.g. in contact with) an illustrated top surface of the first dielectric material layer 102*m*. In some embodiments, the first dielectric material layer 102*m* and the second dielectric material layer 104*m* have different materials. For example, the first dielectric material layer 102*m* includes a silicon carbide (SiC) layer, a silicon nitride ($Si_3N_4$) layer, an aluminum oxide layer, or the like. For example, the second dielectric material layer 104*m* includes a silicon-rich oxide (SRO) layer. In some embodiments, the second dielectric material layer 104*m* is referred to as an inter-metal dielectric (IMD) layer which may be made of a dielectric material, such as silicon oxide, silicon nitride, silicon oxynitride, a spin-on dielectric material, or a low-k dielectric material. It should be noted that the low-k dielectric materials are generally dielectric materials having a dielectric constant lower than 3.9. In some alternative embodiments, the first dielectric material layer 102*m* and the second dielectric material layer 104*m* have different etching selectivities. In the case, the first dielectric material layer 102*m* may be referred to as an etching stop layer to prevent the underlying elements (e.g. the contact plugs 208 and the dielectric layer 206) from damage caused by the over-etching.

As shown in FIG. 1, the hard mask material layer 106*m* and the patterned resist layer 108 may be sequentially stacked on the second dielectric material layer 104*m*. For example, the hard mask material layer 106*m* is disposed on (e.g. in contact with) an illustrated top surface of the second dielectric material layer 104*m*, and the patterned resist layer 108 is disposed on (e.g. in contact with) an illustrated top surface (e.g. a surface 106*t*) of the hard mask material layer 106*m*. The hard mask material layer 106*m* may be a hard mask utilized to help pattern the first dielectric material layer 102*m* and the second dielectric material layer 104*m* (not shown in FIG. 1 but illustrated and discussed below with respect to FIG. 2 through FIG. 4). In some embodiments, the hard mask material layer 106*m* includes an inorganic dielectric material, such as SiON, SiN, SiC, SiOC, SiCN, or a combination thereof. The hard mask material layer 106*m* may be formed by any suitable method, such as CVD. The hard mask material layer 106*m* may have a thickness of about 10 nm to about 100 nm, although other suitable thickness may alternatively be utilized.

As shown in FIG. 1, the patterned resist layer 108 may correspond to a conductive feature (e.g. the contact plugs 208) to be connected with a later-formed conductive feature (e.g. a metallization structure ML1 in FIG. 7). The structure of the metallization structure ML1 will be discussed in greater detail later in conjunction with FIG. 5 through FIG. 7. The later-formed conductive feature may be a metallization pattern such as a redistribution wire/line/via, a connector such as a conductive connector, the like; the disclosure is not limited thereto. That is, the patterned resist layer 108 includes a plurality of openings O1 (each may be referred to as a hole (such as a through hole or an opening hole) or a recess) disposed directly over the contact plugs 208, for example. In some embodiments, positioning locations of the openings O1 are respectively within a positioning location of a respective one of the contact plugs 208 in a vertical projection on the substrate 200 along a stacking direction Z of the first dielectric material layer 102*m* and the second dielectric material layer 104*m*. For illustrative purposes, the number of the openings O1 shown in FIG. 1 does not limit the disclosure, and may be designated and selected based on the demand and layout design.

The patterned resist layer 108 may be a photosensitive material utilized to help pattern the hard mask material layer 106*m* (not shown in FIG. 1 but illustrated and discussed below with respect to FIG. 2 through FIG. 4). The patterned resist layer 108 may be formed to a thickness of between about 10 nm and about 200 nm, although other suitable thickness may alternatively be utilized. The patterned resist layer 108 may be a positive resist material or a negative resist material, that is suitable for a patterning process such as a photolithography process with a mask or a mask-less photolithography process (for instance, an electron-beam (e-beam) writing or an ion-beam writing), and may be formed by any suitable method, such as spin-coating or the like. However, other suitable materials and methods of forming the patterned resist layer 108 may alternatively be utilized.

Figure 2:
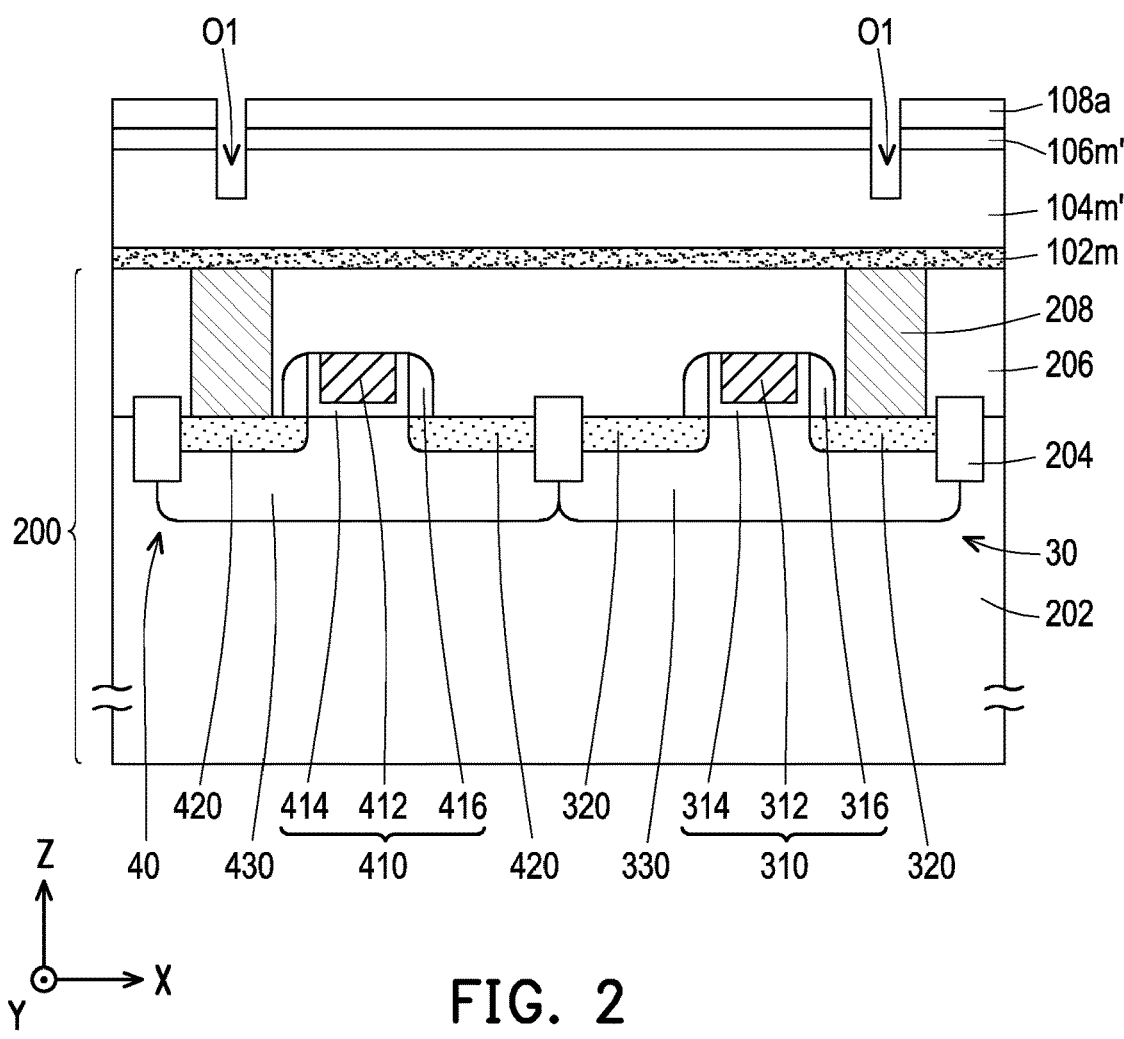

Referring to FIG. 1 and FIG. 2 together, in some embodiments, the hard mask material layer 106*m* and the second dielectric material layer 104*m* are patterned by using the patterned resist layer 108 as a mask. In the case, using the patterned resist layer 108 as the patterning mask, a portion of the hard mask material layer 106*m* is removed to form the hard mask material layer 106*m'*. As shown in FIG. 2, the openings O1 may further extend into the hard mask material layer 106*m'*. For example, the openings O1 completely penetrate through the hard mask material layer 106*m'*. Thereafter, using the patterned resist layer 108 and the hard mask material layer 106*m'* together as the patterning mask, a portion of the second dielectric material layer 104*m* is removed to form the second dielectric material layer 104*m'*, for example. As shown in FIG. 2, the openings O1 may further extend into the second dielectric material layer 104*m'*. For example, the openings O1 partially penetrate the second dielectric material layer 104*m'*. In some embodiments, the openings O1 extends into the second dielectric material layer 104*m'* until reaching to a position which is about ½ to about ⅓ of a thickness of the second dielectric material layer 104*m'*. However, the disclosure is not limited thereto.

The patterned resist layer 108 may be consumed during the patterning processes, thus the patterned resist layer 108*a* may have a thickness less than the thickness of the patterned resist layer 108. The patterning process may include an etching process, such as a dry etching, a wet etching or a combination thereof. For example, the patterning process includes an anisotropic etching process. After the formation of the second dielectric material layer 104*m'*, the patterned resist layer 108*a* may be removed. The removal process may include ashing process, such as using $O_2$ ashing, $N_2$ ashing, $H_2$ ashing, $CO_2$ ashing, or the like, although any other suitable patterning processes may alternatively be utilized. The removal process may include a dry etching, a wet etching or a combination thereof. Alternatively, the removal process may be performed by a dry chemical etch with a plasma source and an etchant gas.

Figure 3:
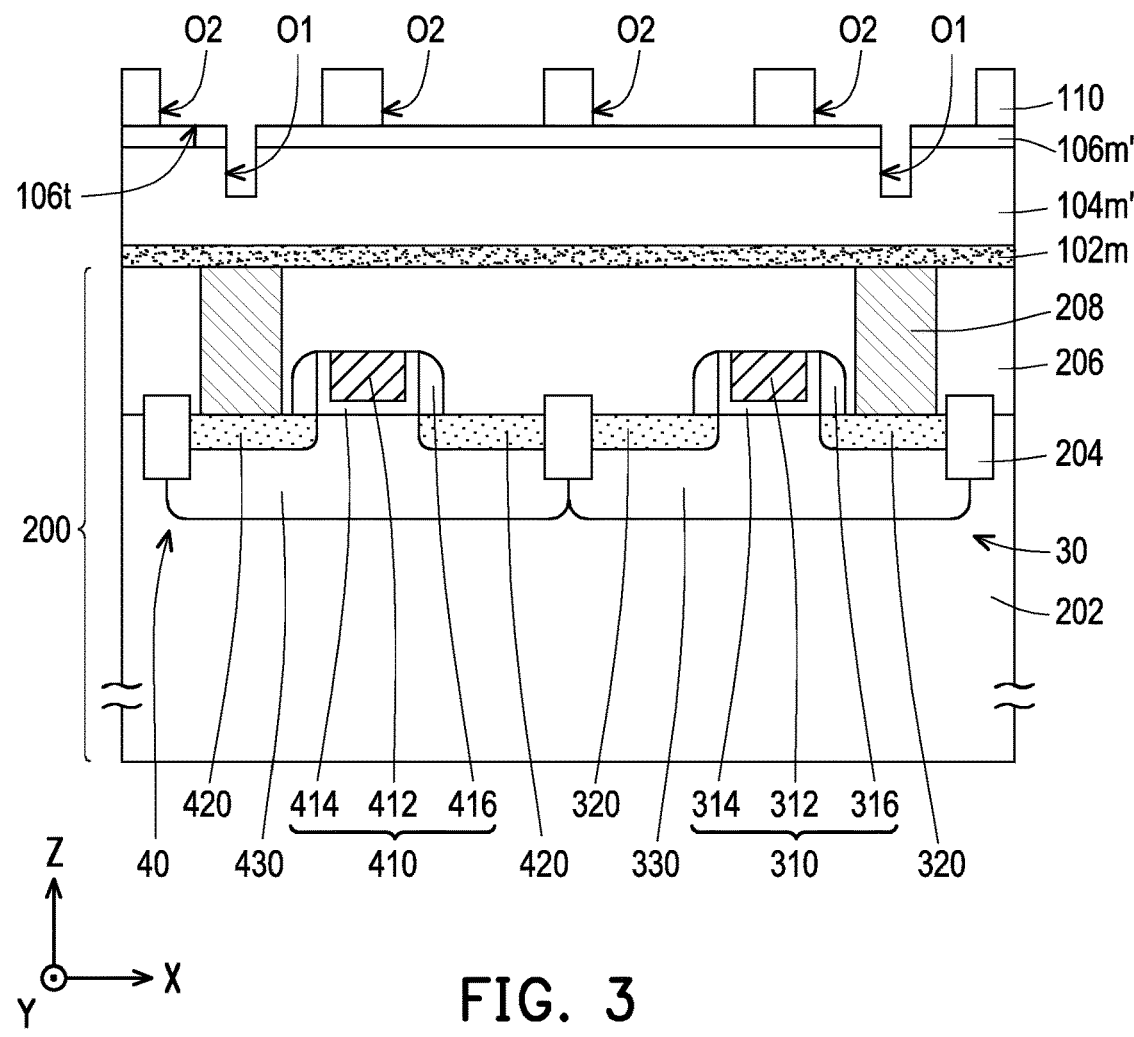

Referring to FIG. 3, in some embodiments, a patterned resist layer 110 is formed on the hard mask material layer 106*m'*, after the removal of the patterned resist layer 108. For example, the patterned resist layer 110 is disposed on (e.g. in contact with) an illustrated top surface (e.g. the surface 106*t*) of the hard mask material layer 106*m'*. The patterned resist layer 110 may correspond to the openings O1 formed in the hard mask material layer 106*m'* and the second dielectric material layer 104*m'*. That is, the patterned resist layer 110 includes a plurality of openings O2 (each may be referred to as a hole (such as a through hole or an opening hole) or a recess) disposed directly over the openings O1, for example. As shown in FIG. 3, a portion of the surface 106*t* of the second dielectric material layer 106*m'* and the openings O1 may be exposed by the openings O2. In some embodiments, positioning locations of the openings O1 are respectively within a positioning location of a respective one of the openings O2 in the vertical projection on the substrate 200 along the stacking direction Z of the first dielectric material layer 102*m* and the second dielectric material layer 104*m'*. That is, a size of the openings O2 is greater than a size of the opening O1, for example.

For illustrative purposes, the number of the openings O2 shown in FIG. 3 does not limit the disclosure, and may be designated and selected based on the demand and layout design. The formation and material of the patterned resist layer 110 are substantially identical to or similar to the process and material of forming the patterned resist layer 108 as described in FIG. 1; except that, the patterned resist layer 110 has a pattern different from that of the patterned resist layer 108, and thus are not repeated herein.

Figure 4:
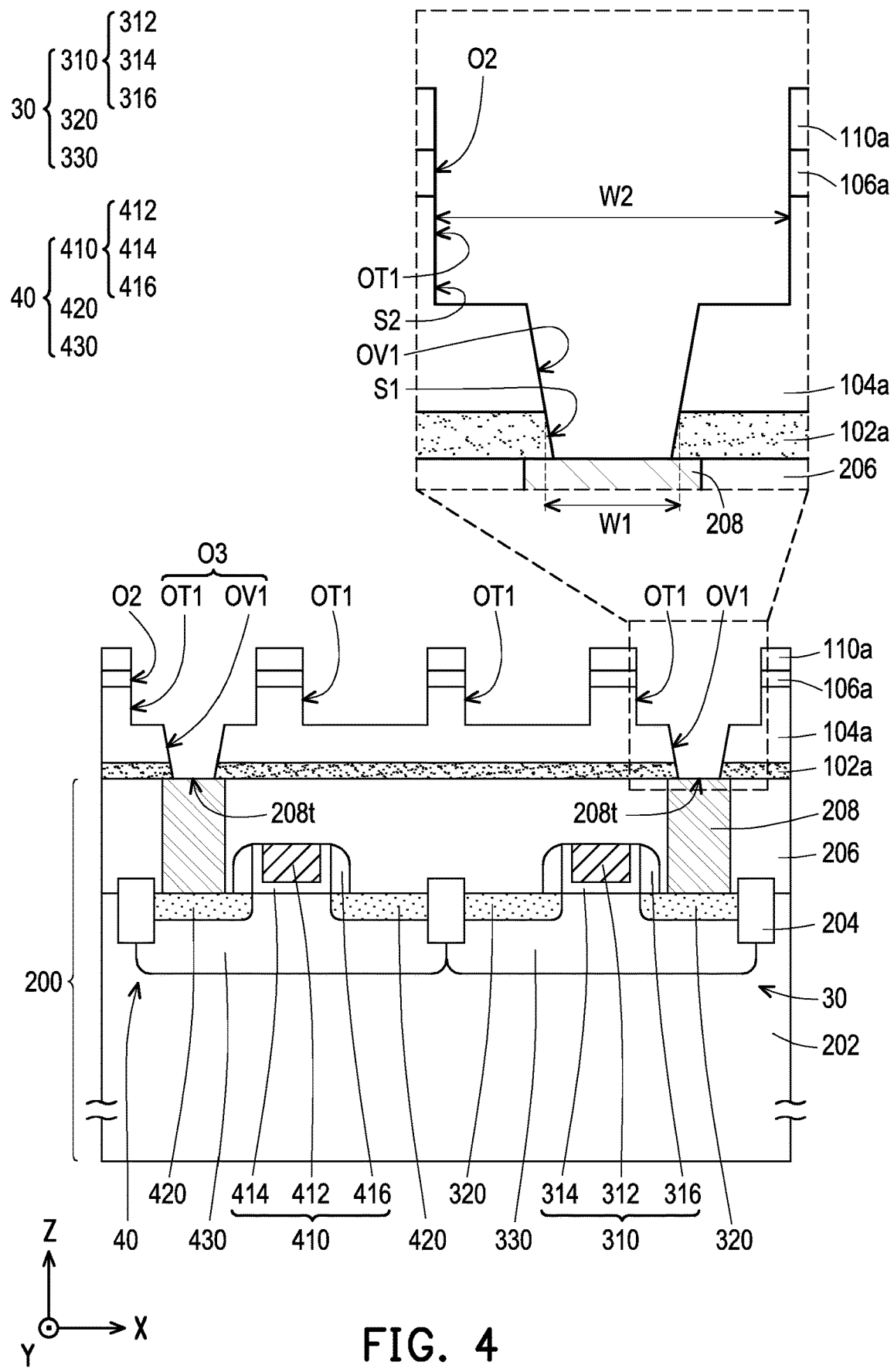

Referring to FIG. 3 and FIG. 4 together, in some embodiments, the hard mask material layer 106*m'*, the second dielectric material layer 104*m'* and the first dielectric material layer 102*m* are patterned by using the patterned resist layer 110 as a mask. In the case, using the patterned resist layer 110 as the patterning mask, a portion of the hard mask material layer 106*m'* is removed to form the hard mask layer 106*a*. As shown in FIG. 4, the openings O2 may further extend into the hard mask layer 106*a*. For example, the openings O2 completely penetrate through the hard mask layer 106*a* (so to remove the openings O1 to form the hard mask layer 106*a*). Thereafter, using the patterned resist layer 110 and the hard mask layer 106*a* together as the patterning mask, a portion of the second dielectric material layer 104*m'* and a portion of the first dielectric material layer 102*m* are removed to form the second dielectric layer 104*a* and the first dielectric layer 102*a*. As shown in FIG. 4, a plurality of openings O3 may be formed in the second dielectric layer 104*a* and the first dielectric layer 102*a*. For example, the openings O3 completely penetrate through the second dielectric layer 104*a* and the first dielectric layer 102*a*. As shown in FIG. 4, surfaces 208*t* of the contact plugs 208 are accessibly revealed by the openings O3, for example.

The openings O3 each may include a trench hole OT1 and a via hole OV1 underlying and spatially communicated to the trench hole OT1. For example, the trench holes OT1 are formed in the second dielectric layer 104a and extend from an illustrated top surface of the second dielectric layer 104a to a position inside the second dielectric layer 104a. For example, the via holes OV1 are formed in the second dielectric layer 104a and the first dielectric layer 102a and extend from the position inside the second dielectric layer 104a to an illustrated bottom surface of the first dielectric layer 102a. The position may be about ½ to about ⅓ of a thickness of the second dielectric layer 104a; however, the disclosure is not limited thereto. In some embodiments, the openings O3 includes a dual damascene structure. The formation of the openings O3 is not limited to the disclosure. The formation of opening O3 (with the dual damascene structure) can be formed by any suitable forming process, such as a via first approach or a trench first approach.

As shown in FIG. 4, a size W2 of the trench holes OT1 may be greater than a size W1 of the via holes OV1. In some embodiments, a sidewall S1 of each of the via holes OV1 is a slant sidewall, see FIG. 4. In alternative embodiments, the sidewall S1 of each of the via holes OV1 is a vertical sidewall (not shown). In some embodiments, a sidewall S2 of each of the trench holes OT1 is a vertical sidewall, see FIG. 4. In alternative embodiments, the sidewall S2 of each of the trench holes OT1 is a slant sidewall (not shown). The sidewall S1 of one via hole OV1 and the sidewall S2 of a respective one trench hole OT1 may be collectively referred to as a sidewall of one opening O3.

For illustrative purposes, the number of the openings O3 shown in FIG. 4 does not limit the disclosure, and may be designated and selected based on the demand and layout design. The number of the openings O3 may be controlled by adjusting the number of the openings O2 formed in the patterned resist layer 110. The profile of the trench holes OT1 may be controllable by adjusting the profile of the openings O2 formed in the patterned resist layer 110, and the profile of the trench holes OT1 may be controllable by adjusting the profile of the openings O1 formed in the patterned resist layer 108.

The patterned resist layer 110 may be consumed during the patterning processes, thus the patterned resist layer 110a may have a thickness less than the thickness of the patterned resist layer 110. The patterning process may include an etching process, such as a dry etching, a wet etching or a combination thereof. For example, the patterning process includes an anisotropic etching process.

After the formation of the second dielectric layer 104a and the first dielectric layer 102a, the patterned resist layer 110a may be removed immediately (not shown) or may be removed in a later sequentially process (such as a planarization in FIG. 7). The removal process may include ashing process, such as using O2 ashing, N2 ashing, H2 ashing, CO2 ashing, or the like, although any other suitable patterning processes may alternatively be utilized. The removal process may include a dry etching, a wet etching or a combination thereof. Alternatively, the removal process may be performed by a dry chemical etch with a plasma source and an etchant gas.

Figure 5:
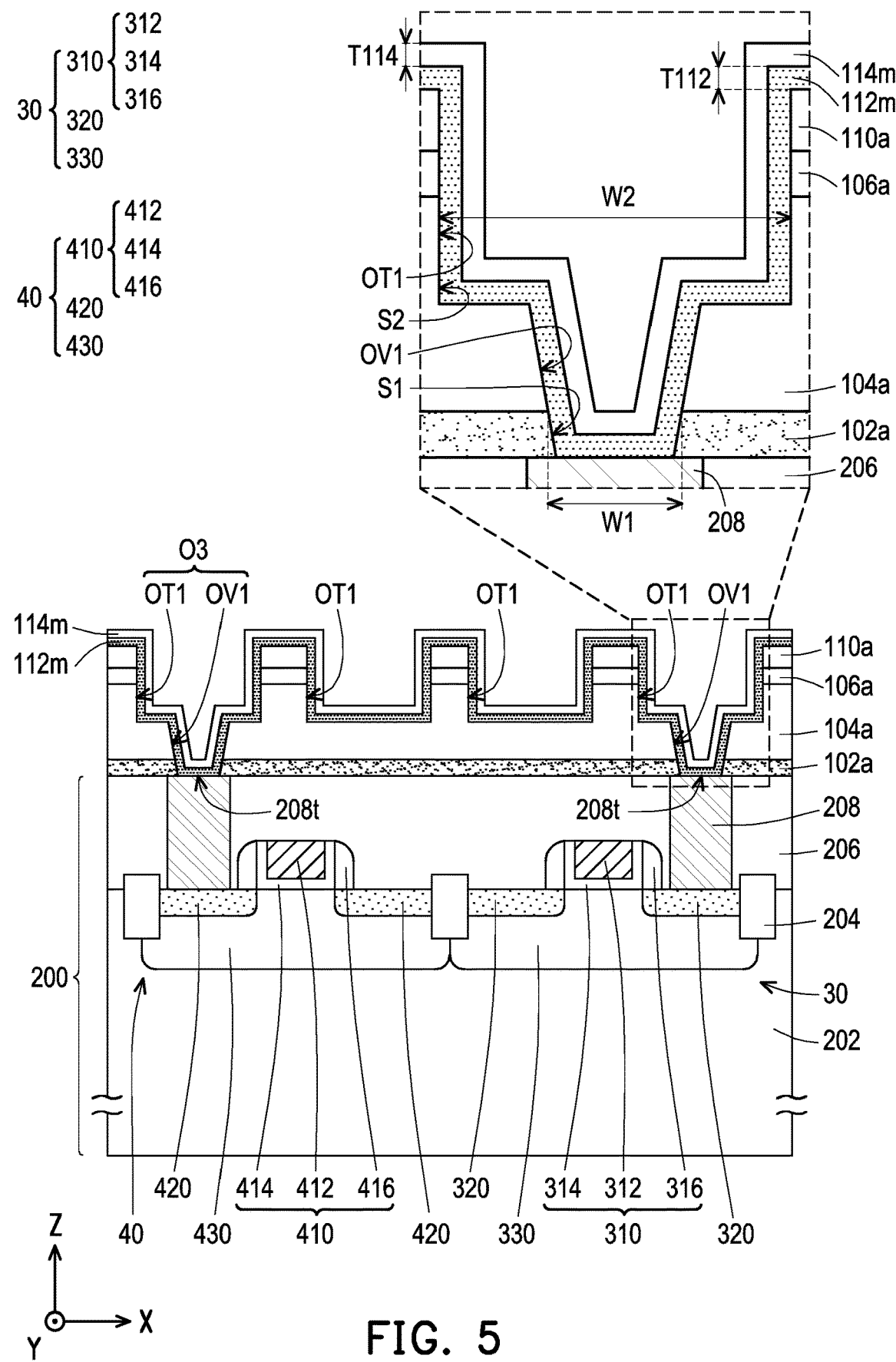

Referring to FIG. 5, in some embodiments, a barrier material 112m and a liner material 114m are sequentially formed over the structure depicted in FIG. 4. As shown in FIG. 5, the barrier material 112m may be conformally formed over the substrate 200. For example, the barrier material 112m further extends into the openings O2 and the openings O3 so to line at least the openings O2 and the openings O3. In some embodiments, the barrier material 112m is in (physical) contact with sidewalls (e.g. S1 and S2) of the openings O3, sidewalls of the openings O2, the surface 208t of the contact plugs 208 exposed by the openings O3, and an illustrated top surface of the patterned resist layer 110. Thereafter, the liner material 114m may be conformally formed over the barrier material 112m. For example, the liner material 114m further extends into the openings O2 and the openings O3 to cover the barrier material 112m. In some embodiments, the liner material 114m is in (physical) contact with an illustrated top surface of the barrier material 112m. In other words, the liner material 114m may at least line the barrier material 112m inside the openings O3. Herein, when a layer is described as conformal or conformally formed, it indicates that the layer has a substantially equal thickness extending along the region on which the layer is formed.

In some embodiments, the barrier material 112m includes a material to prevent the later-formed conductive feature (e.g. the metallization structure ML1 in FIG. 7) from diffusing (e.g., Cu diffusion) to the underlying layers and/or the surrounding layers. The barrier material 112m may include a metal nitride such as TaN, TiN, WN, ThN, VN, ZrN, CrN, WC, WN, WCN, NbN, AlN, a combination thereof, a multilayer thereof, or the like. In some embodiments, the barrier material 112m can be formed using CVD, ALD, PVD, a combination thereof, or the like. In certain embodiments, the barrier material 112m includes TaN or TiN, although any other suitable materials and processes may alternatively be utilized. The barrier material 112m may have a thickness T112 of about 1 nm to about 50 nm, although other suitable thickness may alternatively be utilized. In further alternative embodiments, the barrier material 112m includes a bi-layer structure of Ta/TaN layers or Ti/TiN layers.

In some embodiments, the liner material 114m includes a material to enhance the adhesion between two adjacent layers, such as between the barrier material 112m and the later-formed conductive feature (e.g. the metallization structure ML1 in FIG. 7) for preventing delamination. The liner material 114m may include Ru, Ta, Ti, W, Co, Ni, Al, Nb, AlCu alloy, a combination thereof, a multilayer thereof, or the like. In some embodiments, the liner material 114m can be formed using PVD, CVD (such as PECVD), and ALD. In certain embodiments, the liner material 114m includes Ta or Ti, although any other suitable materials and processes may alternatively be utilized. The liner material 114m may have a thickness T114 of about 1 nm to about 50 nm, although other suitable thickness may alternatively be utilized. The liner material 114m may include a bi-layer structure of Ta/TaN layers or Ti/TiN layers.

Figure 6:
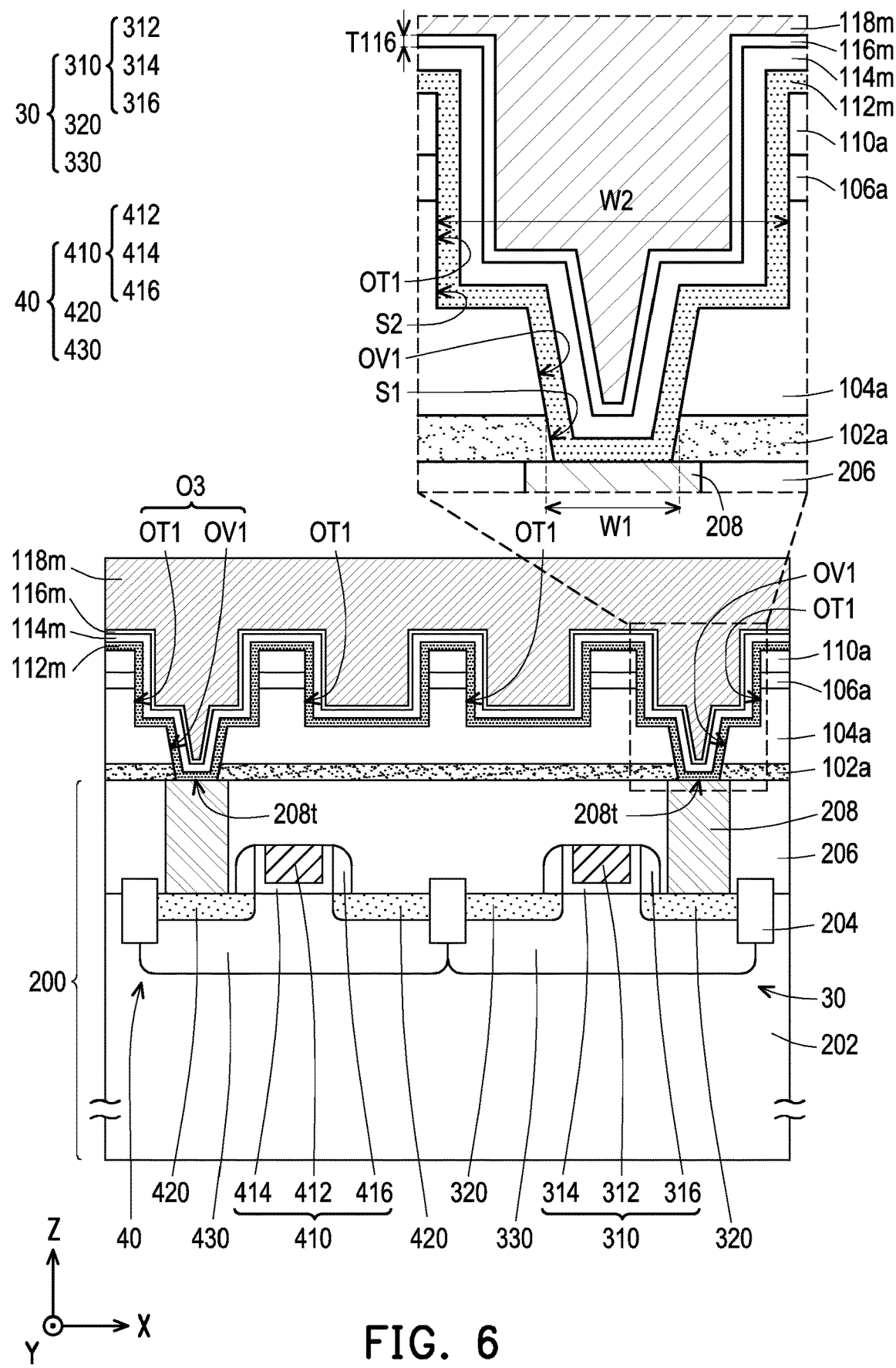

Referring to FIG. 6, in some embodiments, a seed layer material 116m and a conductive material 118m are sequentially formed over the liner material 114m. As shown in FIG. 6, the seed layer material 116m may be disposed on (e.g., in contact with) the liner material 114m. In some embodiments, the seed layer material 116m is conformally formed on the liner material 114m and extends into the openings O3 formed in the first dielectric laye 102a and the second dielectric layer 104a. The openings O3 are completely covered by (e.g., lined with) the seed layer material 116m, for example. In other words, the seed layer material 116m may at least line the liner material 114m inside the openings O3.

In some embodiments, the seed layer material 116m is formed on the liner material 114m in a manner of a blanket layer made of metal or metal alloy materials, the disclosure is not limited thereto. In some embodiments, the seed layer material 116m is referred to as a metal layer, which can be a single layer or a composite layer including a plurality of sub-layers formed of different materials. In some embodiments, the seed layer material 116m includes titanium, copper, molybdenum, tungsten, titanium nitride, titanium tungsten, combinations thereof, or the like. For example, the seed layer material 116m may include a titanium layer and a copper layer over the titanium layer. The seed layer material 116m may be formed using, for example, sputtering, PVD, or the like. The seed layer material 116m may have a thickness T116 of about 1 nm to about 50 nm, although other suitable thickness may alternatively be utilized.

Thereafter, the conductive material 118m may be disposed on (e.g., in contact with) the seed layer material 116m. In some embodiments, the openings O3 are filled with the conductive materials 118m over the seed layer material 116m. In some embodiments, a material of the conductive material 118m includes a suitable conductive material, such as metal and/or metal alloy. For example, the conductive material 118m can be aluminum (Al), aluminum alloys, copper (Cu), copper alloys, or combinations thereof (e.g. AlCu), the like, or combinations thereof. In some embodiments, the conductive material 118m is formed by plating process or any other suitable method, which the plating process may include electroplating or electroless plating, or the like. In alternative embodiments, the conductive material 118m may be formed by deposition. The disclosure is not limited thereto.

Figure 7:
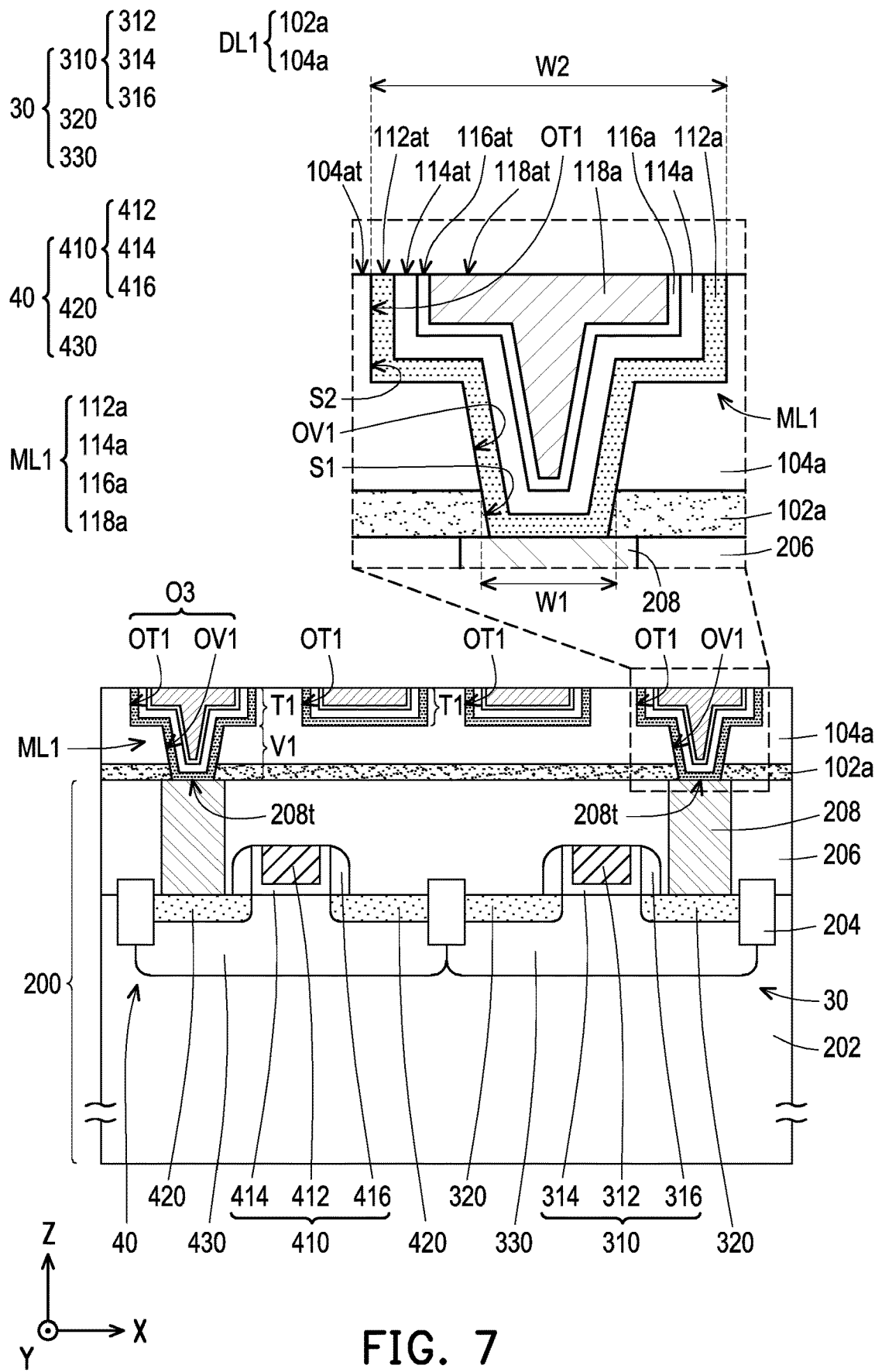

Referring to FIG. 6 and FIG. 7 together, in some embodiments, a planarization process is performed to remove excessive amounts of the conductive material 118m, the seed layer material 116, the liner material 114m, and the barrier material 112m over a plane including an illustrated top surface (e.g. a surface 104at) of the second dielectric layer 104a, thereby forming a barrier layer 112a, a liner layer 114a, a seed layer 116a, and a conductive feature 118a. As shown in FIG. 7, a surface 118at of the conductive feature 118a, a surface 116at of the seed layer 116a, a surface 114at of the liner layer 114a, and a surface 112at of the barrier layer 112a may be substantially leveled with the surface 104at of the second dielectric layer 104a. For example, the surface 118at of the conductive feature 118a, the surface 116at of the seed layer 116a, the surface 114at of the liner layer 114a, and the surface 112at of the barrier layer 112a are substantially coplanar to the surface 104at of the second dielectric layer 104a. The planarization process may include a grinding process, a chemical-mechanical polishing (CMP) process, an etching process, the like, or combinations thereof. During the planarizing process, the second dielectric layer 104a may also be planarized. After planarizing, a cleaning process may be optionally performed, for example to clean and remove the residue generated from the planarizing process. However, the disclosure is not limited thereto, and the planarizing process may be performed through any other suitable method.

In some embodiments, the conductive feature 118a, the seed layer 116a, the liner layer 114a, and the barrier layer 112a are collectively referred to as a metallization structure ML1 (or a metallization or conductive layer, or a metallization or conductive pattern), and the first dielectric layer 102a and the second dielectric layer 104a are collectively referred to as a dielectric structure DL1 (or a dielectric layer). For example, the metallization structure ML1 penetrates through the dielectric structure DL1 and is in contact with the conductive plugs 208 (e.g., the surfaces 208t). That is, the metallization structure ML1 is physically and electrically connected to the PMOS transistor 30 and the NMOS transistor 40 embedded in the substrate 200 through the conductive plugs 208, for example. In some embodiments, the metallization structure ML1 interconnects the (semiconductor) devices included in the substrate 200 for electrically communication therebetween. The metallization structure ML1 may be substantially coplanar with the dielectric structure DL1 at two opposite sides of the dielectric structure DL1 along the stacking direction Z.

As shown in FIG. 7, the metallization structure ML1 may be formed in a form of a plurality of segments. For example, each segment of the metallization structure ML1 is disposed in a respective one opening O3. In some embodiments, a line portion T1 of each segment of the metallization structure ML1 is located at the trench hole OT1 of one opening O3, and a via portion V1 of each segment of the metallization structure ML1 is located at the via hole OV1 of the opening O3. In some embodiments, for each segment of the metallization structure located in one opening O3, the line portion T1 is physically and electrically connected to the via portion V1. In some embodiments, the line portion T1 extends laterally along the X-Y plane, while the via portion V1 extends vertically along the stacking direction Z. The via portion V1 may electrically couple two adjacent conductive features (e.g., the line portion V1 and the contact plugs 208) along the stacking direction Z. As shown in FIG. 7, the via portion V1 may penetrate through the first dielectric layer 102a.

The line portion T1 may also be referred to as a trench portion, a trace portion, or a line portion of the metallization structure ML1. The via portion V1 may also be referred to as a through via portion of the metallization structure ML1. As shown in FIG. 7, the line portion T1 may have a substantially vertical sidewall, and the via portion V1 may have a slant sidewall. However, the disclosure is not limited thereto; alternatively, the line portion T1 and the via portion V1 independently may have a substantially vertical sidewall or a slant sidewall.

Figure 8:
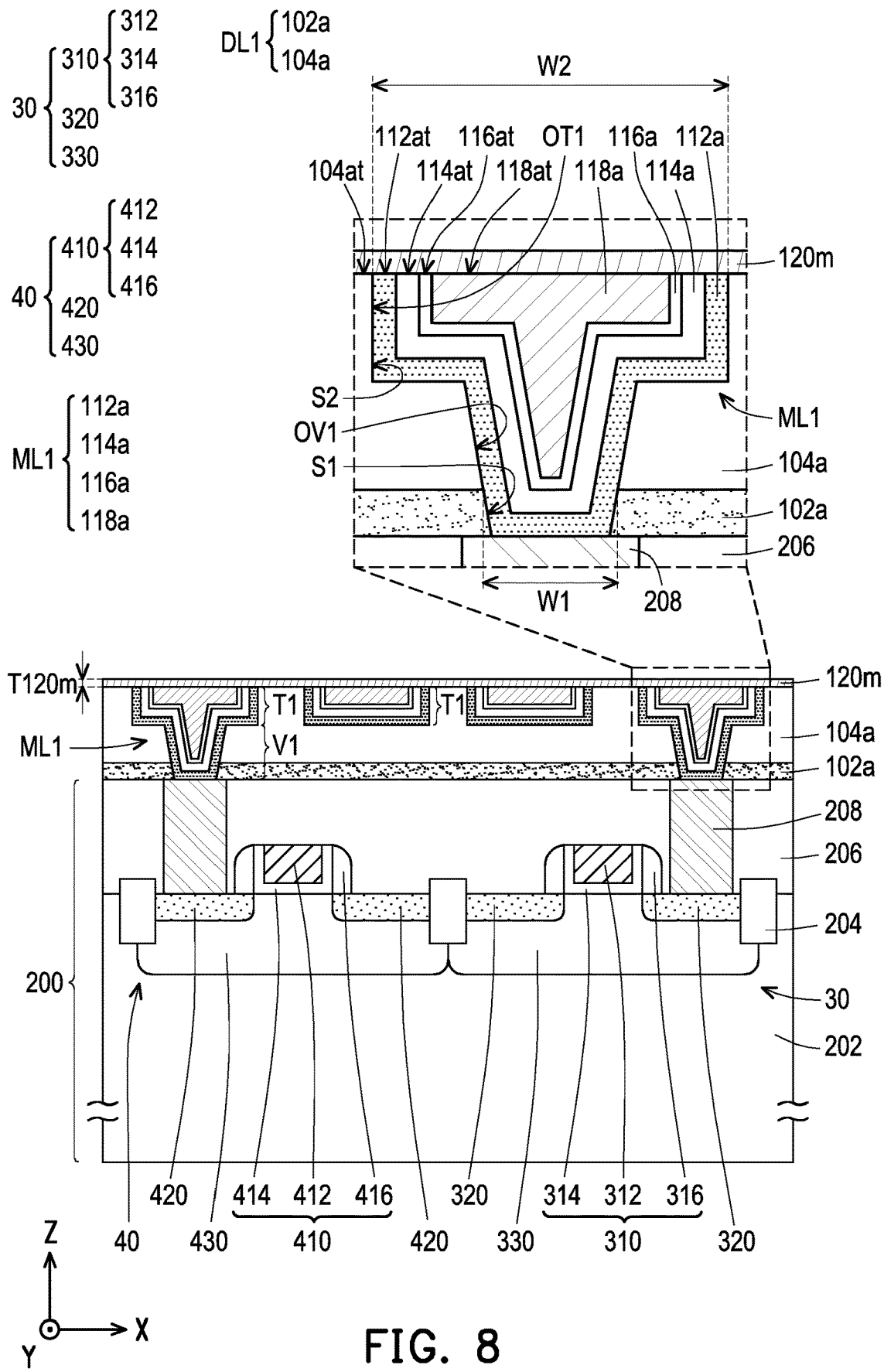

Referring to FIG. 8, in some embodiments, a material layer 120m is formed over the metallization structure ML1. For example, the material layer 120m is disposed on (e.g., in contact with) an illustrated top surface of the metallization structure ML1 being coplanar to an illustrated top surface of the dielectric structure DL1. In some embodiments, the material layer 120m is formed by forming a blanket of an initial capping material over the illustrated top surface of the metallization structure ML1 and the illustrated top surface of the dielectric structure DL1 by a deposition process (such as PVD, ALD, or CVD) or a plating process (such as electroplating or electroless plating). In some embodiments, the initial capping material includes a transition metal selected from the groups IVB, VB, or VIB of the periodic table. For example, the initial capping material includes Ti, Zr, Hf, V, Nb, Ta, Mo, W, Tc, Re, Co, Rh, Ir, Ni, Pd, Pt, or the like. In some embodiments, the initial capping material includes Ta. In the embodiment of which the technology node is N5 or beyond, the material layer 120m has a thickness T120m of about 0.7 nm to about 25 nm, although other suitable thickness may alternatively be utilized. For example, the thickness T120m may be in a range of about 1 nm to about 15 nm. In an alternative embodiment (not shown), as the technology node is N7, N10, N16, N20 and so on (e.g. a larger critical dimension), the material layer 120m may have a thickness T120m of about 3.5 nm to about 50 nm, although other suitable thickness may alternatively be utilized. For example, the thickness T120m may be in a range of about 5 nm to about 50 nm. The material layer 120m may be referred to as a capping material layer.

Figure 9:
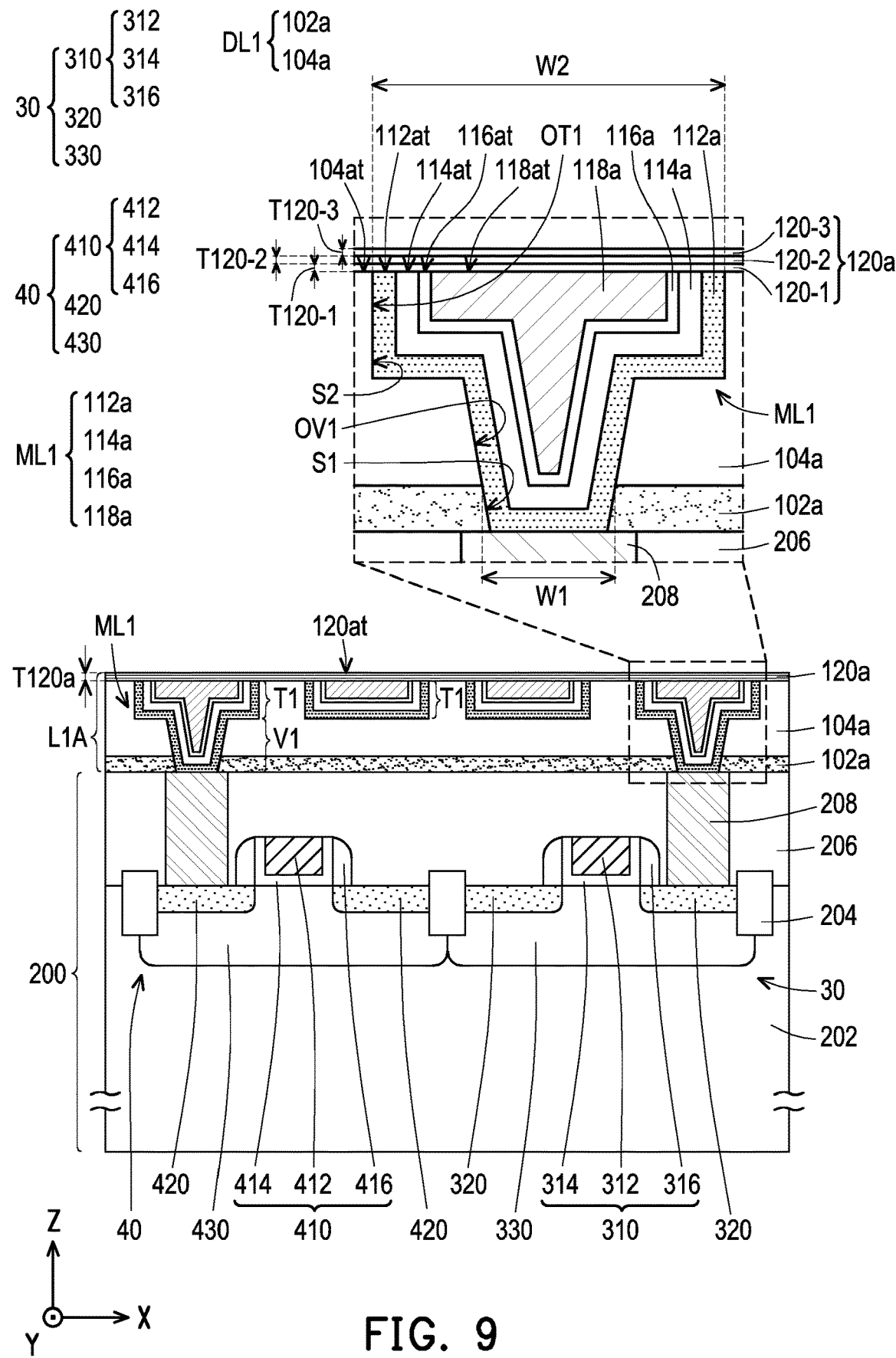

Referring to FIG. 8 and FIG. 9, in some embodiments, a thermal treatment is performed on the material layer 120m to form a capping layer 120a. For example, the capping layer 120a is disposed on (e.g., in contact with) the illustrated top surface (including the surfaces 118at, 116at, 114at and 112at) of the metallization structure ML1. In some embodiments, the capping layer 120a covers the illustrated top surface (including the surfaces 118at, 116at, 114at and 112at) of the metallization structure ML1 and further extends onto the illustrated top surface (e.g. the surface 104at) of the dielectric structure DL1. As shown in FIG. 9, the capping layer 120a may completely cover the illustrated top surfaces of the metallization structure ML1 and the dielectric structure DL1. However, the disclosure is not limited thereto. In some embodiments, the capping layer 120a, the metallization structure ML1 and the dielectric structure DL1 together constitute a build-up layer L1A included in an interconnect structure (e.g., an interconnect 300A of the semiconductor structure 1000 of FIG. 12). Owing to the capping layer 120a, the surface scattering effect occurred at the illustrate top surface of the metallization structure ML1 is suppressed, thereby improving the Rs (line resistance) performance. Therefore, the device performance of the semiconductor structure 1000 is enhanced.

In some embodiments, the capping layer 120a is made of transition metal dichalcogenides or the like. In some embodiments, the transition metal dichalcogenides are represented by a general formula, $MX_{n1}$, where M is a transition metal selected from the groups IVB, VB, or VIB of the periodic table, X is one element selected from a group consisting of sulfur (S), selenium (Se), and tellurium (Te), and n1 is in a range of 0.5-2. The material of the capping layer 120a may be referred to as a two-dimensional (2D) material. However, the disclosure is not limited thereto; in some alternative embodiments, a non-limiting example of the transition metal dichalcogenides is represented by a general formula, $Ta_{n2}S_{n3}$, where n2 is in a range of 1-2, and n3 is in a range of 2-5. For example, the capping layer 120a includes $TaS_2$, $Ta_2S_5$, or a combination of $TaS_2$ and $Ta_2S_5$. In the embodiments of which the capping layer 120a includes $TaS_2$, $Ta_2S_5$, or the combination of $TaS_2$ and $Ta_2S_5$, the material of the capping layer 120a further includes $TaO_2$. However, the disclosure is not limited thereto.

In the embodiment of which the technology node is N5 or beyond, the capping layer 120a has a thickness T120a of about 0.7 nm to about 25 nm, although other suitable thickness may alternatively be utilized. For example, the thickness T120a may be in a range of about 1 nm to about 15 nm. In alternative embodiments (not shown), as the technology node is N7, N10, N16, N20 and so on (e.g. a larger critical dimension), the capping layer 120a may have a thickness T120a of about 3.5 nm to about 50 nm, although other suitable thickness may alternatively be utilized. For example, the thickness T120a may be in a range of about 5 nm to about 50 nm. The thickness T120a of the capping layer 120a may be substantially the same as the thickness T120m of the material layer 120m. For example, the thickness T120a of the capping layer 120a is identical to the thickness T120m of the material layer 120m.

In some embodiments, the thermal treatment is performed in a manner with a CVD tool, such as a cold wall CVD chamber. In the embodiments of which the capping layer 120a includes $TaS_2$, the thermal treatment is a PECVD process for reacting the material layer 120m with a precursor (involving sulfur) to obtain the capping layer 120a, and is performed in a cold wall CVD chamber at a pressure in a range from about 10 mTorr to about 760 mTorr, at a temperature in a range from about 400° C. to about 800° C., at a power in a range from about 200 watts (W) to about 450 watts, with a gas flow including from about 35 standard cubic centimeters per minute (sccm) to about 65 sccm of dimethyl disulfide (DMDS) (serving as a precursor) and from about 1 sccm to about 100 sccm of a carrier gas. However, the disclosure is not limited thereto. For example, the carrier gas includes Ar or the like.

In alternative embodiments, the thermal treatment is performed in a manner with a furnace tool. In the embodiments of which the capping layer 120a includes $TaS_2$, the thermal treatment is a heating process for reacting the material layer 120m with a precursor (involving sulfur) to obtain the capping layer 120a, and is performed in a furnace at a pressure in a range from about 10 mTorr to about 760 mTorr, at a temperature in a range from about 400° C. to about 800° C., at a power in a range from about 60 watts W to about 100 watts, with a gas flow including from about 5 sccm to about 15 sccm of $H_2S$ (serving as a precursor) and from about 5 sccm to about 15 sccm of Ar. That is, the embodiments of which the capping layer 120a includes $TaS_2$, the thermal treatment performed on the material layer 120m is a sulfidation process.

The capping layer 120a may include one or more than one sub-layer. In some embodiments, the capping layer 120a includes a single layer structure, such as having only one sub-layer. In alternative embodiments, the capping layer 120a includes a layered structure, such as having more than one sub-layer. As shown in FIG. 9, the capping layer 120a may include a plurality of sub-layers, such as sub-layers 120-1, 120-2 and 120-3. In some embodiments, each of the sub-layers 120-1, 120-2 and 120-3 is a monolayer structure having a thickness ranging approximately from 0.7 nm to 5 nm. For example, the sub-layers 120-1 may have a thickness T120-1 of about 0.7 nm to about 5 nm, the sub-layers 120-2 may have a thickness T120-2 of about 0.7 nm to about 5 nm, and the sub-layers 120-3 may have a thickness T120-3 of about 0.7 nm to about 5 nm. Only three sub-layers included in the capping layer 120a are shown in FIG. 9 for illustrative purposes, however the disclosure is not limited thereto. In certain embodiments of which the technology node is N5 or beyond, the number of the sub-layers included in the capping layer 120a is one to five layers. In alternative embodiments (not shown), as the technology node is N7, N10, N16, N20 and so on (e.g. a larger critical dimension), the number of the sub-layers included in the capping layer 120a is more than five layers.

In some embodiments, materials of the sub-layers 120-1, 120-2 and 120-3 include the material of the capping layer 120a as aforementioned, and thus are not repeated herein. For example, the material of the capping layer 120a is a homogenous material throughout, where the materials of the sub-layers 120-1, 120-2 and 120-3 are identical to each other.

Figure 10A:
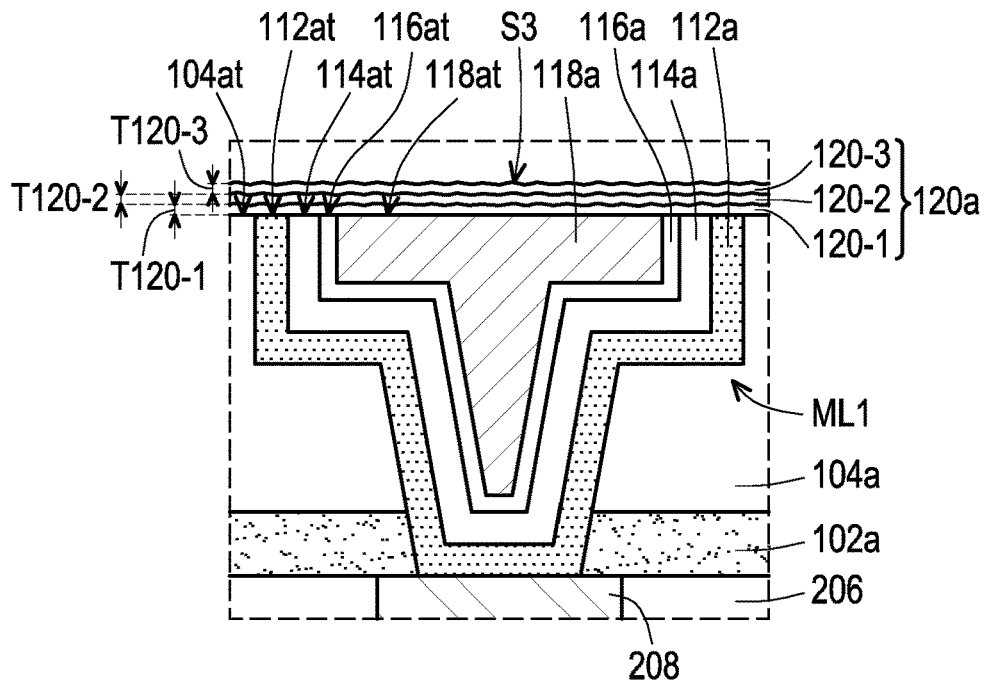
FIG. 10A and FIG. 10B are respectively an enlarged and schematic cross-sectional view showing a capping layer in a dashed area A outlined in FIG. 9 in accordance with some alternative embodiments of the disclosure.

The capping layer 120a may include a flat structure. As shown in FIG. 9, for example, in the cross-sectional view, a top surface 120at of the capping layer 120a is flat and planar. In other words, the sub-layers 120-1, 120-2 and 120-3 individually may be a conformal layer having a substantially constant thickness with a high degree of coplanarity. Alternatively, in the cross-sectional view, the top surface (e.g., a surface S3) of the capping layer 120a may be in a concave-and-convex form (in periodic order), where the sub-layers 120-1, 120-2 and 120-3 independently may be a layer having a substantially constant thickness, as shown in FIG. 10A.

Figure 10B:
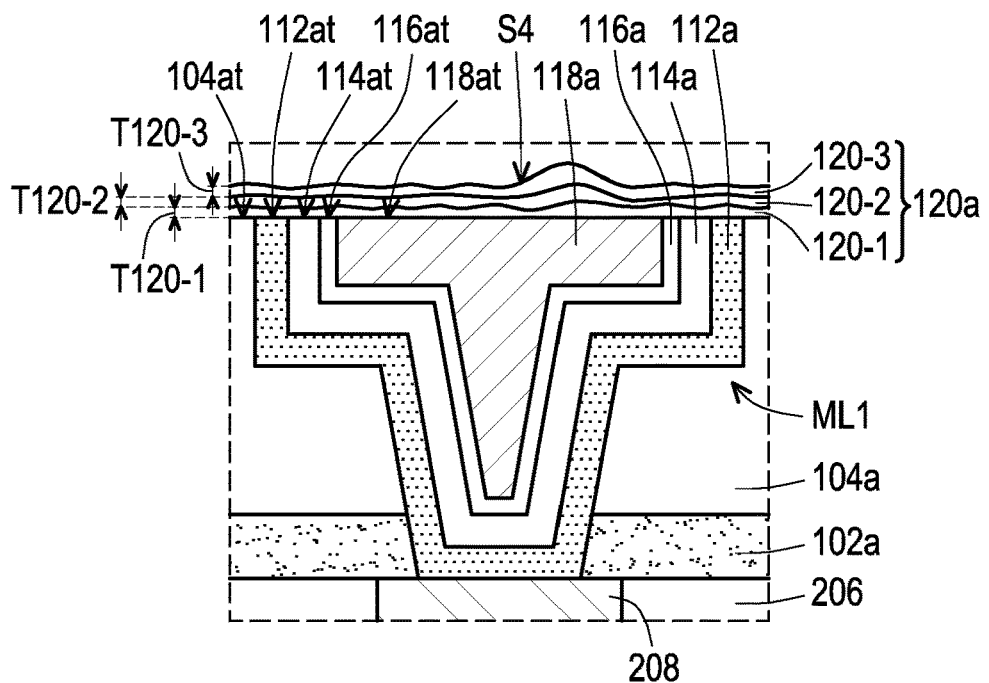

However, the disclosure is not limited thereto; the capping layer 120a may include a waving structure. In the cross-sectional view, the top surface (e.g., a surface S4) of the capping layer 120a may be in a wave-form (in a non-periodic order), where at least one of the sub-layers 120-1, 120-2 and 120-3 may be a layer having a non-constant thickness, as shown in FIG. 10B.

Figure 11:
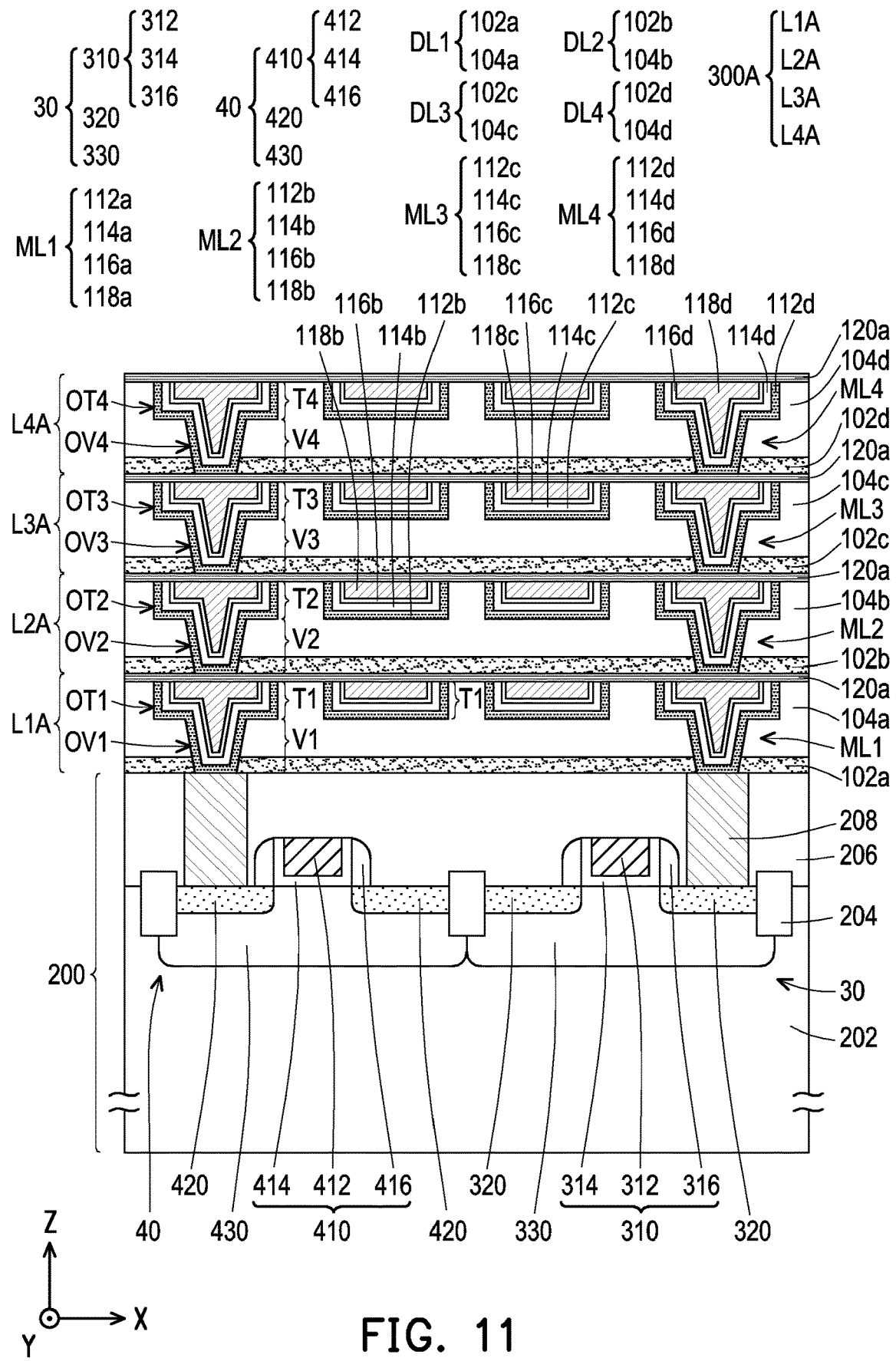

Referring to FIG. 11, in some embodiments, a build-up layer L2A, a build-up layer L3A and a build-up layer L4A are sequentially formed over the build-up layer L1A to form the interconnect 300A over the substrate 200. The interconnect 300A may be referred as an interconnect structure, a redistribution layer or a redistribution structure of the semiconductor structure 1000, which provides routing functions for the devices formed in the substrate 200 of the semiconductor structure 1000. Owing to the interconnect 300A, the devices formed in the substrate 200 can be electrically coupled and electrically communicated to each other and/or to external components.

The build-layer layer L2A is disposed on (e.g., in contact with) the build-layer layer L1A, as shown in FIG. 11. For example, the build-up layer L2A includes a dielectric structure DL2 (including a first dielectric layer 102b and a second dielectric layer 104b stacked thereon), a metallization structure ML2 (including a barrier layer 112b, a liner layer 114b, a seed layer 116b, and a conductive feature 118b), and a capping layer 120a covering the dielectric structure DL2 and the metallization structure ML2. In some embodiments, the metallization structure ML2 penetrates through the dielectric structure DL2 to electrically couple to the metallization structure ML1 of the build-up layer L1A. As shown in FIG. 11, the surface 120at of the capping layer 120a of the build-up layer L1A may be covered by the dielectric structure DL2 (e.g. the first dielectric layer 102b), where a sidewall of the capping layer 120a of the build-up layer L1A may be free from the dielectric structure DL2 (e.g. the first dielectric layer 102b). That is, the sidewall of the capping layer 120a of the build-up layer L1A is substantially aligned with a sidewall of the dielectric structure DL2 and a sidewall of the dielectric structure DL1, for example. In some embodiments, the dielectric structure DL2 and the metallization structure ML2 of the build-up layer L2A are sandwiched between the capping layer 120a of the build-up layer L2A and the capping layer 120a of the build-up layer L1A. Owing to the capping layer 120a, the surface scattering effect occurred at illustrate top and bottom surfaces of the metallization structure ML2 is suppressed, thereby improving the Rs (line resistance) performance. The device performance of the semiconductor structure 1000 is enhanced. The formation and material of the first dielectric layer 102b, the second dielectric layer 104b, the barrier layer 112b, the liner layer 114b, the seed layer 116b, and the conductive feature 118b are substantially identical to or similar to the process and material of forming the first dielectric layer 102a, the second dielectric layer 104a, the barrier layer 112a, the liner layer 114a, the seed layer 116a, and the conductive feature 118a as described in FIG. 1 through FIG. 7, and the details of the capping layer 120a have been previously described in FIG. 8 and FIG. 9 in conjunction with FIG. 10A and FIG. 10B; thus, are not repeated herein for brevity.

The build-layer layer L3A is disposed on (e.g., in contact with) the build-layer layer L2A, as shown in FIG. 11. For example, the build-up layer L3A includes a dielectric structure DL3 (including a first dielectric layer 102c and a second dielectric layer 104c stacked thereon), a metallization structure ML3 (including a barrier layer 112c, a liner layer 114c, a seed layer 116c, and a conductive feature 118c), and a capping layer 120a covering the dielectric structure DL3 and the metallization structure ML3. In some embodiments, the metallization structure ML3 penetrates through the dielectric structure DL3 to electrically couple to the metallization structure ML2 of the build-up layer L2A. As shown in FIG. 11, an illustrated top surface of the capping layer 120a of the build-layer layer L2A may be covered by the dielectric structure DL3 (e.g. the first dielectric layer 102c), where a sidewall of the capping layer 120a of the build-layer layer L2A may be free from the dielectric structure DL3 (e.g. the first dielectric layer 102c). That is, the sidewall of the capping layer 120a of the build-layer layer L2A is substantially aligned with a sidewall of the dielectric structure DL3 and the sidewall of the dielectric structure DL2, for example. In some embodiments, the dielectric structure DL3 and the metallization structure ML3 of the build-up layer L3A are sandwiched between the capping layer 120a of the build-up layer L3A and the capping layer 120a of the build-up layer L2A. Owing to the capping layer 120a, the surface scattering effect occurred at illustrate top and bottom surfaces of the metallization structure ML3 is suppressed, thereby improving the Rs (line resistance) performance. The device performance of the semiconductor structure 1000 is enhanced. The formation and material of the first dielectric layer 102c, the second dielectric layer 104c, the barrier layer 112c, the liner layer 114c, the seed layer 116c, and the conductive feature 118c are substantially identical to or similar to the process and material of forming the first dielectric layer 102a, the second dielectric layer 104a, the barrier layer 112a, the liner layer 114a, the seed layer 116a, and the conductive feature 118a as described in FIG. 1 through FIG. 7, and the details of the capping layer 120a have been previously described in FIG. 8 and FIG. 9 in conjunction with FIG. 10A and FIG. 10B; thus, are not repeated herein for brevity.

The build-layer layer L4A is disposed on (e.g., in contact with) the build-layer layer L3A, as shown in FIG. 11. For example, the build-up layer L4A includes a dielectric structure DL4 (including a first dielectric layer 102d and a second dielectric layer 104d stacked thereon), a metallization structure ML4 (including a barrier layer 112d, a liner layer 114d, a seed layer 116d, and a conductive feature 118d), and a capping layer 120a covering the dielectric structure DL4 and the metallization structure ML4. In some embodiments, the metallization structure ML4 penetrates through the dielectric structure DL4 to electrically couple to the metallization structure ML3 of the build-up layer L3A. As shown in FIG. 11, an top illustrated surface of the capping layer 120a of the build-layer layer L3A may be covered by the dielectric structure DL4 (e.g. the first dielectric layer 102d), where a sidewall of the capping layer 120a of the build-layer layer L3A may be free from the dielectric structure DL4 (e.g. the first dielectric layer 102d). That is, the sidewall of the capping layer 120a of the build-layer layer L3A is substantially aligned with a sidewall of the dielectric structure DL4 and the sidewall of the dielectric structure DL3, for example. In some embodiments, the dielectric structure DL4 and the metallization structure ML4 of the build-up layer L4A are sandwiched between the capping layer 120a of the build-up layer L4A and the capping layer 120a of the build-up layer L3A. Owing to the capping layer 120a, the surface scattering effect occurred at illustrate top and bottom surfaces of the metallization structure ML4 is suppressed, thereby improving the Rs (line resistance) performance. The device performance of the semiconductor structure 1000 is enhanced. The formation and material of the first dielectric layer 102d, the second dielectric layer 104d, the barrier layer 112d, the liner layer 114d, the seed layer 116d, and the conductive feature 118d are substantially identical to or similar to the process and material of forming the first dielectric layer 102a, the second dielectric layer 104a, the barrier layer 112a, the liner layer 114a, the seed layer 116a, and the conductive feature 118a as described in FIG. 1 through FIG. 7, and the details of the capping layer 120a have been previously described in FIG. 8 and FIG. 9 in conjunction with FIG. 10A and FIG. 10B; thus, are not repeated herein for brevity.

For illustration purpose, four build-up layers are included in the interconnect 300A of FIG. 11; however, the disclosure is not limited thereto. The number of the build-up layer included in the interconnect 300A is not limited in the disclosure, and may be selected based on the demand and design layout. That is, the number of the build-up layer included in the interconnect 300A may be one or more than one as long as the interconnect 300A can provide a sufficient routing function to the devices (e.g., 30 and/or 40) included in the substrate 200.

Referring to FIG. 12, in some embodiments, after the formation of the interconnect 300A, a passivation layer 400, a plurality of under-bump metallurgy (UBM) patterns 500, and conductive terminals 600 are sequentially formed over the interconnect 300A to form the semiconductor structure 1000. As shown in FIG. 12, a top illustrated surface of the capping layer 120a of the build-up layer L4A may be covered by the passivation layer 400, where a sidewall of the capping layer 120a of the build-up layer L4A may be free from the passivation layer 400. That is, the sidewall of the capping layer 120a of the build-up layer L4A is substantially aligned with a sidewall of the passivation layer 400 and the sidewall of the dielectric structure DL4, for example. In some embodiments, the UBM patterns 500 penetrate through the passivation layer 400 to electrically couple the metallization structure ML4 of the build-up layer L4A. In some embodiments, the conductive terminals 600 are disposed over the UBM patterns 500 to electrically couple the metallization structure ML4 of the build-up layer L4A through the UBM patterns 500. Due to the UBM patterns 500, the adhesion between the conductive terminals 600 and the interconnect 300A is enhanced. For example, at least some of the conductive terminals 600 are electrically connected to the devices (e.g. 30 and/40) included in the substrate 200 through the interconnect 300A.

For example, the passivation layer 400 is disposed on (e.g., in contact with) the interconnect 300A (e.g. on an outermost surface 300t of the interconnect 300A). The outermost surface 300t of the interconnect 300A may be a surface 120at of the capping layer 120a included in the build-up layer L4A, as shown in FIG. 12. In some embodiments, the passivation layer 400 is extended on the surface 120at of the capping layer 120a included in the build-up layer L4A. In some embodiments, the passivation layer 400 accessibly reveals the capping layer 120a included in the build-up layer L4A through a plurality of openings (not labeled) formed in the passivation layer 400 for electrically connecting the metallization structure ML4 included in the build-up layer L4A to the later-formed connectors. In some embodiments, the passivation layer 400 is formed by, but not limited to, forming a blanket layer of dielectric material over the outermost surface 300t of the interconnect 300A to completely cover the capping layer 120a included in the build-up layer L4A and patterning the dielectric material blanket layer to form the passivation layer 400 with the openings exposing the portions of the capping layer 120a included in the build-up layer L4A underneath thereto. The material of the passivation layer 400 may be polyimide, polybenzoxazole (PBO), benzocyclobutene (BCB), a nitride such as silicon nitride, an oxide such as silicon oxide, PSG, BSG, BPSG, a combination thereof or the like, which may be patterned using a photolithography and/or etching process. In some embodiments, the dielectric material blanket layer is formed by suitable fabrication techniques such as spin-on coating, CVD, (e.g. PECVD), or the like. In some embodiments, the passivation layer 400 is referred to as a protective layer of the interconnect 300A for providing protection thereto.

In some embodiments, the UBM patterns 500 are disposed on the passivation layer 400 and further extended into the openings formed in the passivation layer 400. The UBM patterns 500 are in (physically) contact with the capping layer 120a included in the build-up layer L4A for electrically connecting the interconnect 300A, as shown in FIG. 12. In the disclosure, the UBM patterns 500 facilitate electrical connections between the interconnect 300A and the conductive terminals 600. However, the disclosure is not limited thereto; alternatively, the UBM patterns 500 may be omitted based on the design layout and demand. The material of the UBM patterns 500 may include copper, nickel, titanium, tungsten, or alloys thereof or the like, and may be formed in a manner of a mono-layer or a multi-layer (e.g. with different materials in any two or more stacked layers in one UBM pattern 500) by an electroplating process and an etching process. The number of the UBM patterns 500 is not limited in the disclosure, and corresponds to the numbers of the later-formed conductive elements.

In some embodiments, the conductive terminals 600 are attached to the UBM patterns 500 through a solder flux. In some embodiments, the conductive terminals 600 are disposed on the UBM patterns 500 by ball placement process or reflow process. The conductive terminals 600 are, for example, micro-bumps, chip connectors (e.g. controlled collapse chip connection (C4) bumps), ball grid array (BGA) balls, solder balls or other connectors. The number of the conductive terminals 600 is not limited to the disclosure, and may be designated and selected based on the numbers of the openings formed in the passivation layer 400. When solder is used, the solder may include either eutectic solder or non-eutectic solder. The solder may include lead or be lead-free, and may include Sn—Ag, Sn—Cu, Sn—Ag—Cu, or the like. In one embodiment, the conductive terminals 600 are referred to as conductive connectors for connecting with another package or a circuit substrate (e.g. organic substrate such as printed circuit board (PCB)). In an alternative embodiment, the conductive terminals 600 are referred to as conductive terminals for inputting/outputting electric and/or power signals. In a further alternative embodiment, the conductive terminals 600 are referred to as conductive terminals for connecting with one or more than one semiconductor dies independently including active devices (e.g., transistors, diodes, etc.) and/or passive devices (e.g., capacitors, resistors, inductors, etc.), other components such as one or more than one integrated passive device (IPDs), or combinations thereof. The disclosure is not limited thereto.

The capping layers 120a of the disclosure each are a continuous layer, for example. However, the disclosure is not limited thereto. Alternatively, a capping layer of the disclosure may be a discontinuous layer with a plurality of segments separated from one another, see a semiconductor structure 2000 of FIG. 15.

Figure 13:
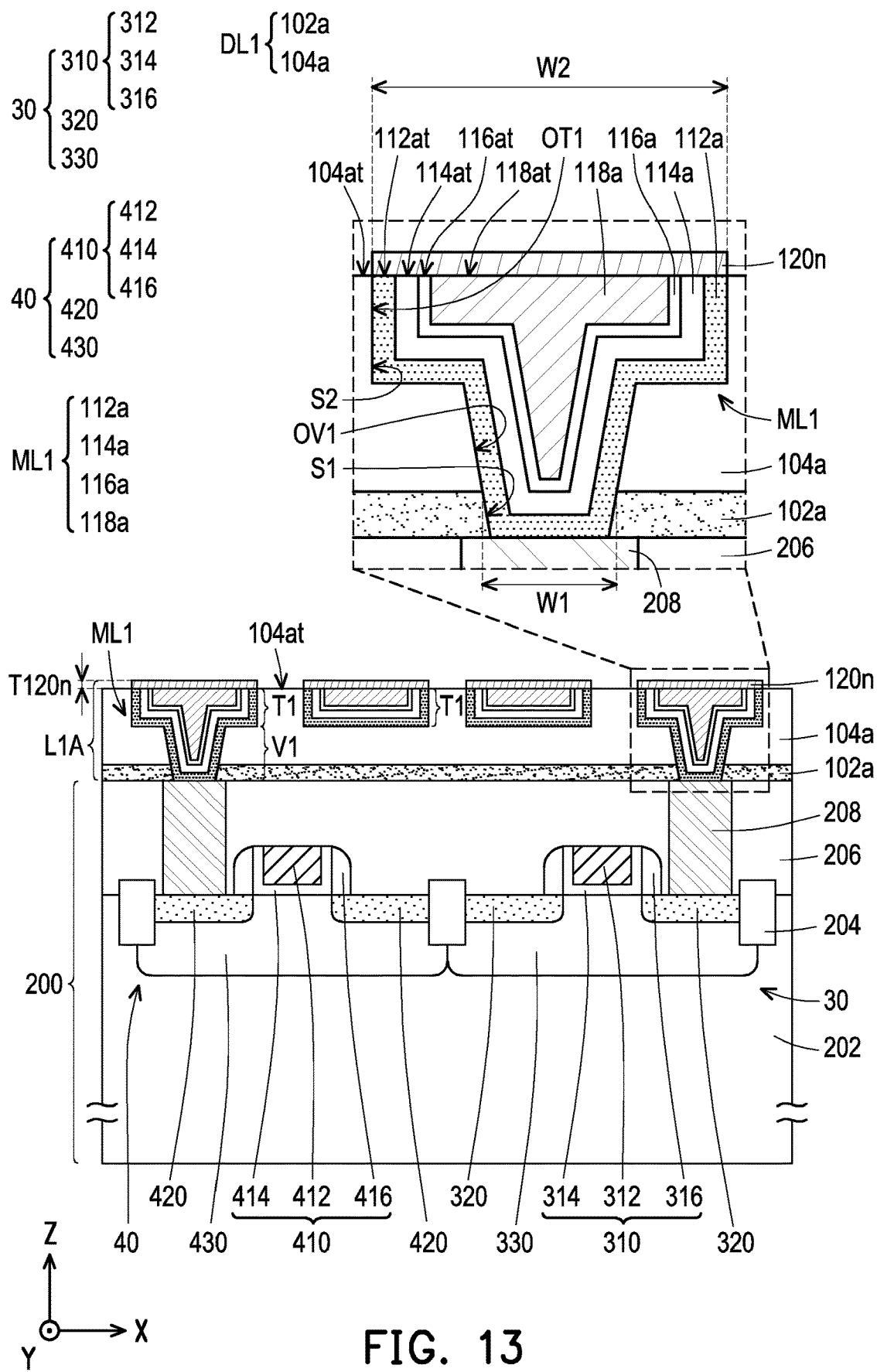
FIG. 13 through FIG. 15 are schematic cross-sectional views showing a method of manufacturing a semiconductor structure in accordance with some alternative embodiments of the disclosure.
Figure 14:
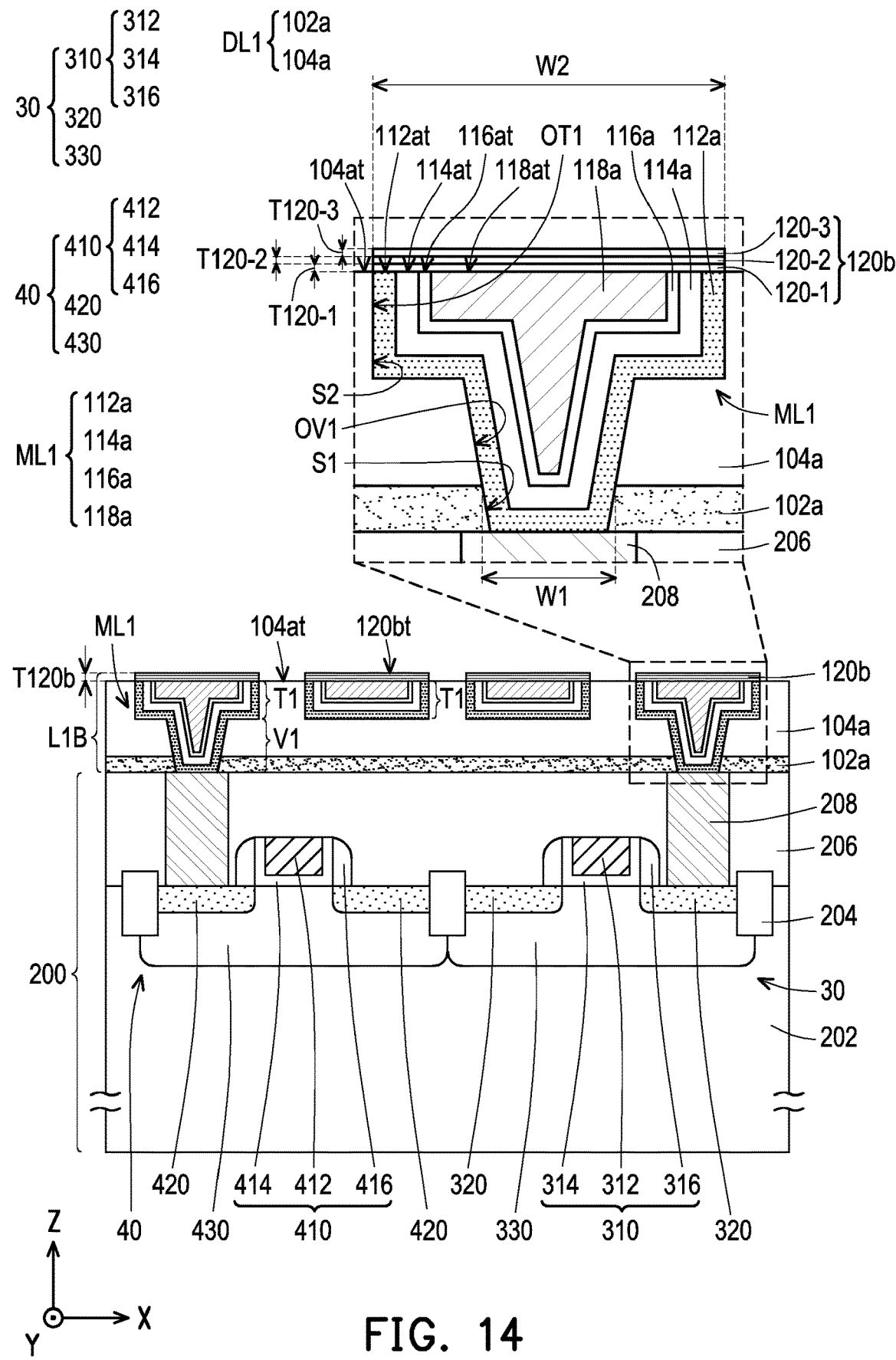
Figure 15:
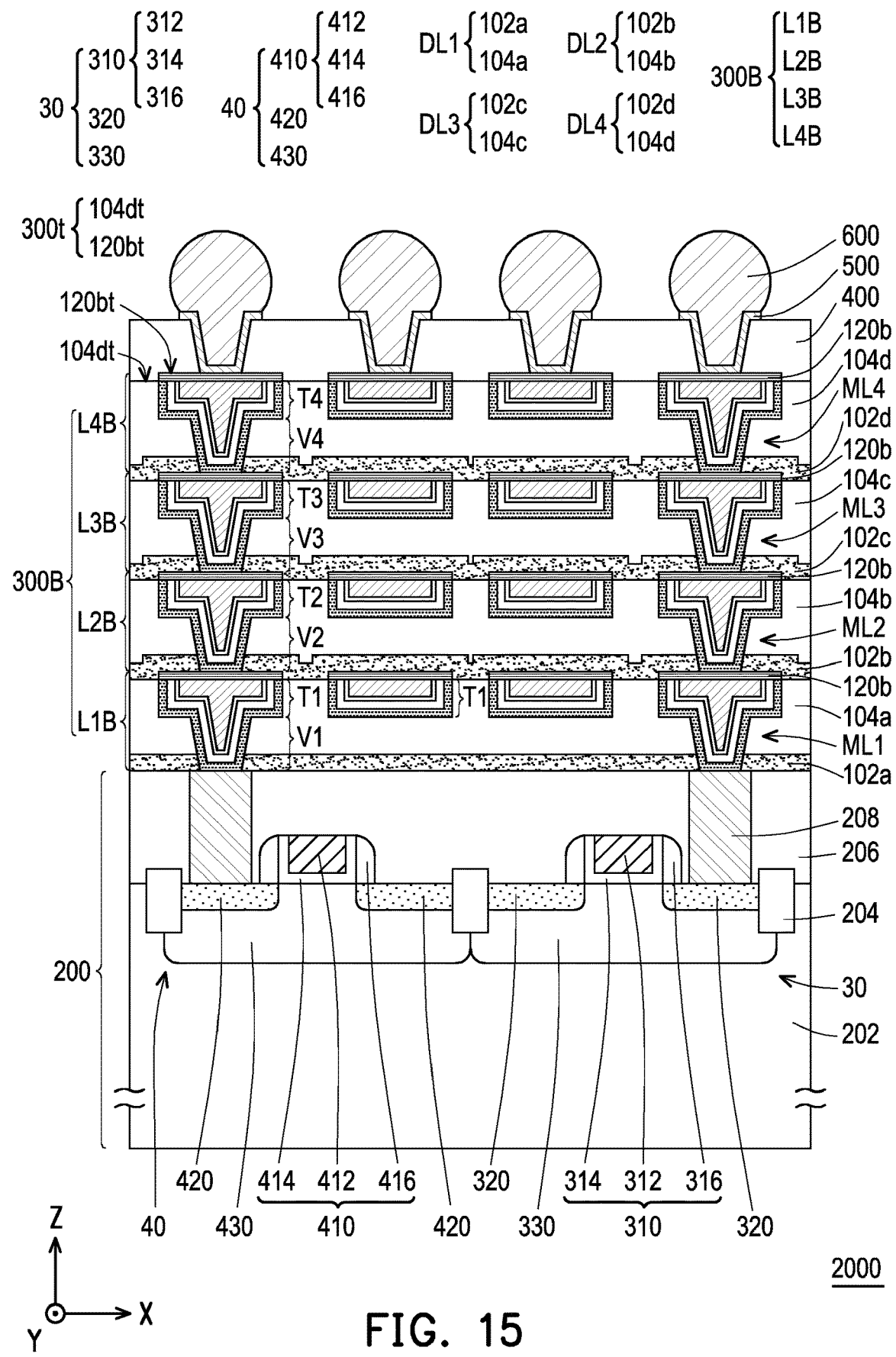

FIG. 13 through FIG. 15 are schematic cross-sectional views showing a method of manufacturing a semiconductor structure in accordance with some alternative embodiments of the disclosure. The elements similar to or substantially the same as the elements described previously will use the same reference numbers, and certain details or descriptions (e.g. the materials, formation processes, positioning configurations, electrical connections, etc.) of the same elements would not be repeated herein.

Referring to FIG. 13, in some embodiments, a material layer 120n is selectively formed over is formed over the metallization structure ML1, following the process as described in FIG. 7. For example, the material layer 120n is disposed on (e.g., in contact with) the illustrated top surface (including the surfaces 118at, 116at, 114at and 112at) of the metallization structure ML1 being coplanar to the illustrated top surface of the dielectric structure DL1. In some embodiments, the material layer 120n is free from the dielectric structure DL1. As shown in FIG. 13, the material layer 120n may not cover (e.g. not extend onto) the surface S104at of the second dielectric layer 104a, for example. A material of the material layer 120n is substantially identical to or similar to the material of the material layer 120m as previously described in FIG. 8, and thus are not repeated herein for brevity. In some embodiments, the material layer 120n includes Ta. In the embodiment of which the technology node is N5 or beyond, the material layer 120n has a thickness T120n of about 0.7 nm to about 25 nm, although other suitable thickness may alternatively be utilized. For example, the thickness T120n may be in a range of about 1 nm to about 15 nm. In alternative embodiments (not shown), as the technology node is N7, N10, N16, N20 and so on (e.g. a larger critical dimension), the material layer 120n may have a thickness T120n of about 3.5 nm to about 50 nm, although other suitable thickness may alternatively be utilized. For example, the thickness T120n may be in a range of about 5 nm to about 50 nm. The material layer 120n may be referred to as a capping material layer.

Referring to FIG. 14, in some embodiments, a thermal treatment is performed on the material layer 120n to form a capping layer 120b. For example, the capping layer 120b is disposed on (e.g., in contact with) the illustrated top surface (including the surfaces 118at, 116at, 114at and 112at) of the metallization structure ML1. In some embodiments, the capping layer 120b only covers the illustrated top surface (including the surfaces 118at, 116at, 114at and 112at) of the metallization structure ML1. As shown in FIG. 14, the capping layer 120b may completely cover the illustrated top surfaces of the metallization structure ML1 and may not cover (or extend onto) the dielectric structure DL1. In some embodiments, the capping layer 120b, the metallization structure ML1 and the dielectric structure DL1 together constitute a build-up layer L1B included in an interconnect structure (e.g., an interconnect 300B of the semiconductor structure 2000 of FIG. 15). Owing to the capping layer 120b, the surface scattering effect occurred at the illustrate top surface of the metallization structure ML1 is still suppressed, thereby improving the Rs (line resistance) performance. Therefore, the device performance of the semiconductor structure 2000 is enhanced. The formation and material of the capping layer 120b are substantially identical to or similar to the process and material of forming the capping layer 120a as described in FIG. 9 in conjunction with FIG. 10A and FIG. 10B; thus, are not repeated herein for brevity.

In the embodiment of which the technology node is N5 or beyond, the capping layer 120b has a thickness T120b of about 0.7 nm to about 25 nm, although other suitable thickness may alternatively be utilized. For example, the thickness T120b may be in a range of about 1 nm to about 15 nm. In alternative embodiments (not shown), as the technology node is N7, N10, N16, N20 and so on (e.g. a larger critical dimension), the capping layer 120b may have a thickness T120a of about 3.5 nm to about 50 nm, although other suitable thickness may alternatively be utilized. For example, the thickness T120b may be in a range of about 5 nm to about 50 nm. The thickness T120b of the capping layer 120b may be substantially the same as the thickness T120n of the material layer 120n. For example, the thickness T120b of the capping layer 120b is identical to the thickness T120n of the material layer 120n.

The capping layer 120b may include one or more than one sub-layer. In some embodiments, the capping layer 120b includes a single layer structure, such as having only one sub-layer. In alternative embodiments, the capping layer 120b includes a layered structure, such as having more than one sub-layer. As shown in FIG. 14, the capping layer 120b may include a plurality of sub-layers, such as sub-layers 120-1, 120-2 and 120-3. Only three sub-layers included in the capping layer 120b are shown in FIG. 14 for illustrative purposes, however the disclosure is not limited thereto. In certain embodiments of which the technology node is N5 or beyond, the number of the sub-layers included in the capping layer 120b is one to five layers. In alternative embodiments (not shown), as the technology node is N7, N10, N16, N20 and so on (e.g. a larger critical dimension), the number of the sub-layers included in the capping layer 120b is more than five layers. The details of the sub-layers 120-1, 120-2 and 120-3 have been previously described in FIG. 9 in conjunction with FIG. 10A and FIG. 10B; thus, are not repeated herein for brevity.

In alternative embodiments, the capping layer 120b may be formed by performing a patterning process on the structure depicted in FIG. 9, prior the formation of the build-up layers stacked thereon for forming the interconnect. During the pattering process, a portion of the capping layer 120a (of FIG. 9) is removed to form the capping layer 120b (of FIG. 14). The patterning process may include photolithography and etching processes. The etching process may include dry etching, wet etching, or a combination thereof.

Referring to FIG. 15, in some embodiments, a build-up layer L2B, a build-up layer L3B and a build-up layer L4B are sequentially formed over the build-up layer L1B to form the interconnect 300B over the substrate 200. The interconnect 300B may be referred as an interconnect structure, a redistribution layer or a redistribution structure of the semiconductor structure 2000, which provides routing functions for the devices formed in the substrate 200 of the semiconductor structure 2000. Owing to the interconnect 300B, the devices formed in the substrate 200 can be electrically coupled and electrically communicated to each other and/or to external components. In some embodiments, the build-up layer L2B, the build-up layer L3B and the build-up layer L4B of the interconnect 300B in FIG. 15 are similar to the build-up layer L2A, the build-up layer L3A and the build-up layer L4A of the interconnect 300A in FIG. 12, the difference is that, in each of the build-up layer L2B, the build-up layer L3B and the build-up layer L4B, the capping layer 120a is substituted by a capping layer 120b. The details of the capping layer 120b have been previously described in FIG. 13 and FIG. 14; thus, are not repeated herein for brevity. Owing to the capping layers 120b, the surface scattering effect occurred at illustrate top and bottom surfaces of the metallization structures ML2, ML3 and ML4 is still suppressed, thereby improving the Rs (line resistance) performance. The device performance of the semiconductor structure 2000 is enhanced.

In some embodiments, after forming the interconnect 300B, the process of FIG. 12 is performed to sequentially form a passivation layer 400, a plurality of UBM patterns 500 and a plurality of conductive terminals 600 over the interconnect 300B. Up to here, the semiconductor structure 2000 is manufactured. In some embodiments, the passivation layer 400 is disposed on (e.g., in contact with) an outermost surface 300t (including a surface 120bt and a surface 104dt) of the interconnect 300B. In some embodiments, the UBM patterns 500 penetrate through the passivation layer 400 to electrically couple the metallization structure ML4 of the build-up layer L4B. In some embodiments, the conductive terminals 600 are disposed over the UBM patterns 500 to electrically couple the metallization structure ML4 of the build-up layer L4B through the UBM patterns 500. Due to the UBM patterns 500, the adhesion between the conductive terminals 600 and the interconnect 300B is enhanced. For example, at least some of the conductive terminals 600 are electrically connected to the devices (e.g. 30 and/40) included in the substrate 200 through the interconnect 300B. However, the disclosure is not limited thereto; alternatively, the UBM patterns 500 may be omitted based on the design layout and demand.

As shown in FIG. 15, a sidewall and the surface 120bt of the capping layer 120b of the build-up layer L1B may be covered by the dielectric structure DL2 (e.g. the first dielectric layer 102b). That is, the sidewall of the capping layer 120b of the build-up layer L1B is not aligned with a sidewall of the dielectric structure DL2 and a sidewall of the dielectric structure DL1, for example. As shown in FIG. 15, a sidewall and an illustrated top surface of the capping layer 120b of the build-layer layer L2B may be covered by the dielectric structure DL3 (e.g. the first dielectric layer 102c). That is, the sidewall of the capping layer 120b of the build-layer layer L2B is not aligned with a sidewall of the dielectric structure DL3 and the sidewall of the dielectric structure DL2, for example. As shown in FIG. 15, a sidewall and a top illustrated surface of the capping layer 120b of the build-layer layer L3B may be covered by the dielectric structure DL4 (e.g. the first dielectric layer 102d). That is, the sidewall of the capping layer 120b of the build-layer layer L3B is not aligned with a sidewall of the dielectric structure DL4 and the sidewall of the dielectric structure DL3, for example. As shown in FIG. 15, a sidewall and a top illustrated surface of the capping layer 120b of the build-up layer L4B may be covered by the passivation layer 400. That is, the sidewall of the capping layer 120b of the build-up layer L4B is not aligned with a sidewall of the passivation layer 400 and the sidewall of the dielectric structure DL4, for example.

The capping layer of the disclosure has a good barrier property for preventing a later-formed conductive feature from diffusing (e.g., Cu diffusion) to the underlying layers and/or the surrounding layers and a good liner property for enhancing the adhesion between two adjacent layers. Owing to such capping layer, a liner layer may be substituted by the capping layer disclosed herein, see a semiconductor structure 3000 of FIG. 19 and a semiconductor structure 4000 of FIG. 20. However, the disclosure is not limited thereto. Alternatively, owing to such capping layer, a liner layer and a barrier layer may be substituted by the capping layer disclosed herein, see a semiconductor structure 5000 of FIG. 21 and a semiconductor structure 6000 of FIG. 22.

FIG. 16 through FIG. 19 are schematic cross-sectional views showing a method of manufacturing a semiconductor structure in accordance with some alternative embodiments of the disclosure. The elements similar to or substantially the same as the elements described previously will use the same reference numbers, and certain details or descriptions (e.g. the materials, formation processes, positioning configurations, electrical connections, etc.) of the same elements would not be repeated herein.

Figure 16:
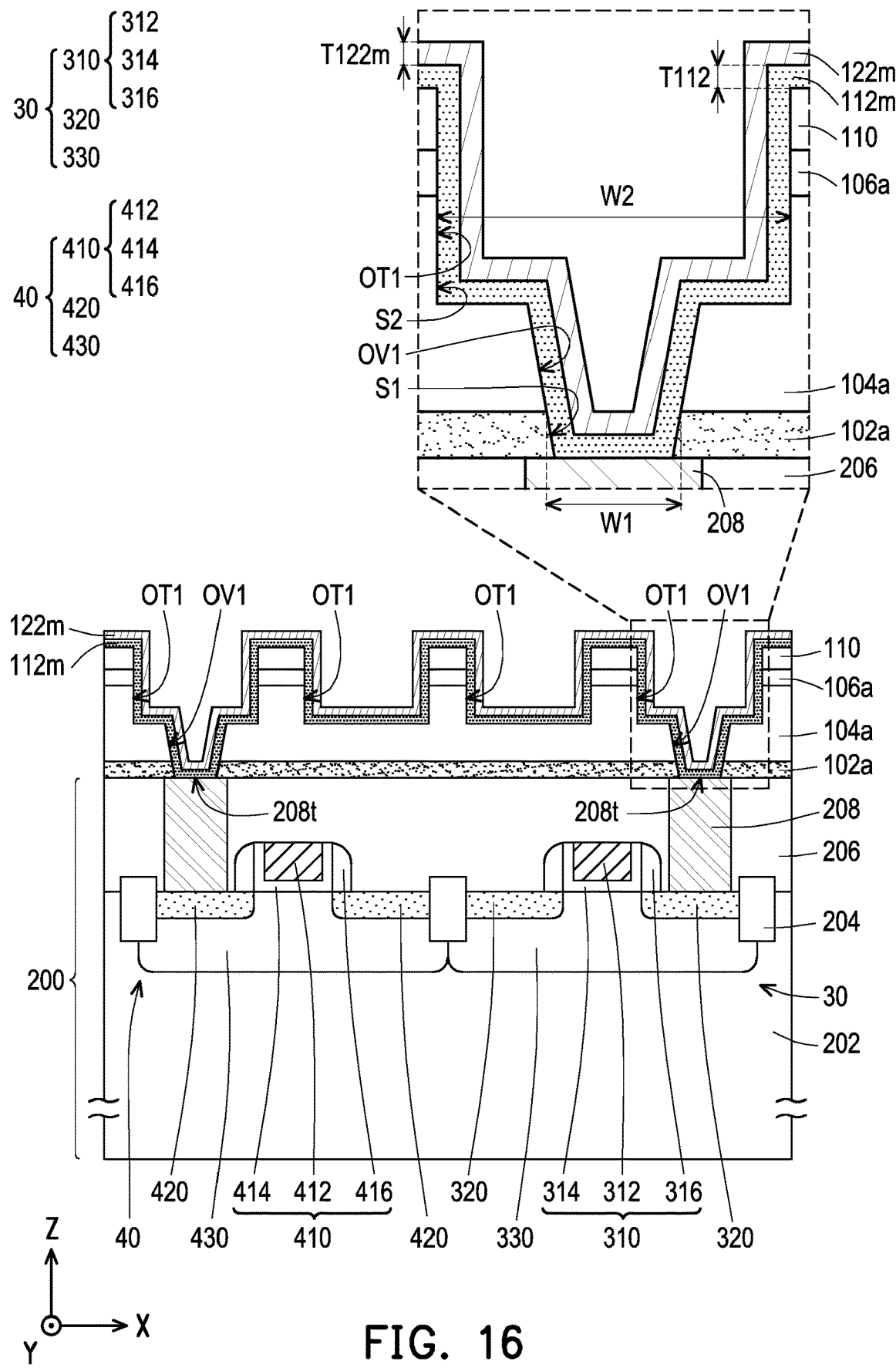
FIG. 16 through FIG. 19 are schematic cross-sectional views showing a method of manufacturing a semiconductor structure in accordance with some alternative embodiments of the disclosure.

Referring to FIG. 16, in some embodiments, a barrier material 112m and a material layer 122m are sequentially formed over the structure depicted in FIG. 4. As shown in FIG. 16, the barrier material 112m may be conformally formed over the substrate 200. For example, the barrier material 112m is extended into the openings O3 (including the trench hole OT1 and the via hole OV1) to be in (physical) contact with the contact plugs 208. The formation, material and positioning configuration of the barrier material 112m have been previously described in FIG. 5, and thus are not repeated herein. Thereafter, a material layer 122m may be conformally formed over the barrier material 112m. For example, the material layer 122m further extends into the openings O2 formed in the hard mask layer 106a and the patterned resist layer 110 and the openings O3 formed in the first dielectric layer 102a and the second dielectric layer 104a to cover the barrier material 112m. In some embodiments, the material layer 122m is in (physical) contact with an illustrated top surface of the barrier material 112m. In other words, the material layer 122m may at least line the barrier material 112m inside the openings O3.

A material of the material layer 122m is substantially identical to or similar to the material of the material layer 120m as previously described in FIG. 8, and thus are not repeated herein for brevity. In some embodiments, the material layer 122m includes Ta. In the embodiment of which the technology node is N5 or beyond, the material layer 122m has a thickness T122m of about 0.7 nm to about 25 nm, although other suitable thickness may alternatively be utilized. For example, the thickness T122m may be in a range of about 1 nm to about 15 nm. In alternative embodiments (not shown), as the technology node is N7, N10, N16, N20 and so on (e.g. a larger critical dimension), the material layer 122m may have a thickness T122m of about 3.5 nm to about 50 nm, although other suitable thickness may alternatively be utilized. For example, the thickness T122m may be in a range of about 5 nm to about 50 nm. The material layer 122m may be referred to as a capping material layer.

Figure 17:
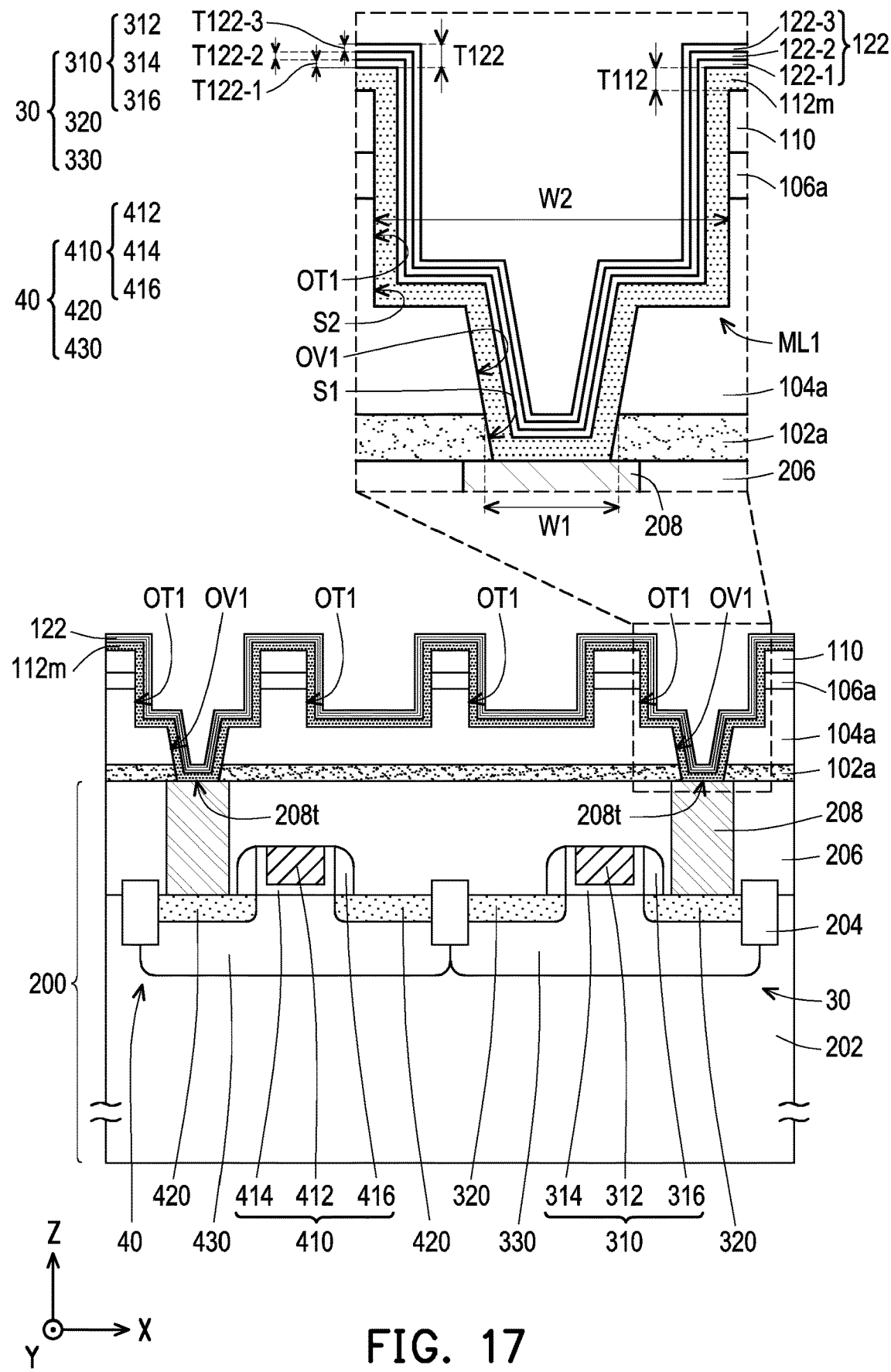

Referring to FIG. 17, in some embodiments, a thermal treatment is performed on the material layer 122m to form a capping layer 122. For example, the capping layer 122 is disposed on (e.g., in contact with) the illustrated top surface of the barrier material 112m. The formation and material of the capping layer 122 are substantially identical to or similar to the process and material of forming the capping layer 120a as described in FIG. 9 in conjunction with FIG. 10A and FIG. 10B or the process and material of forming the capping layer 120b as described in FIG. 13 in conjunction with FIG. 10A and FIG. 10B; thus, are not repeated herein for brevity. In the embodiment of which the technology node is N5 or beyond, the capping layer 122 has a thickness T122 of about 0.7 nm to about 25 nm, although other suitable thickness may alternatively be utilized. For example, the thickness T122 may be in a range of about 1 nm to about 15 nm. In alternative embodiments (not shown), as the technology node is N7, N10, N16, N20 and so on (e.g. a larger critical dimension), the capping layer 122 may have a thickness T122 of about 3.5 nm to about 50 nm, although other suitable thickness may alternatively be utilized. For example, the thickness T122 may be in a range of about 5 nm to about 50 nm. The thickness T122 of the capping layer 122 may be substantially the same as the thickness T122m of the material layer 122m. For example, the thickness T122 of the capping layer 122 is identical to the thickness T122m of the material layer 122m.

The capping layer 122 may include one or more than one sub-layer. In some embodiments, the capping layer 122 includes a single layer structure, such as having only one sub-layer. In alternative embodiments, the capping layer 122 includes a layered structure, such as having more than one sub-layer. As shown in FIG. 17, the capping layer 122 may include a plurality of sub-layers, such as sub-layers 122-1, 122-2 and 122-3. In some embodiments, each of the sub-layers 122-1, 122-2 and 122-3 is a monolayer structure having a thickness ranging approximately from 0.7 nm to 5 nm. For example, the sub-layers 122-1 may have a thickness T122-1 of about 0.7 nm to about 5 nm, the sub-layers 122-2 may have a thickness T122-2 of about 0.7 nm to about 5 nm, and the sub-layers 122-3 may have a thickness T122-3 of about 0.7 nm to about 5 nm. Only three sub-layers included in the capping layer 122 are shown in FIG. 17 for illustrative purposes, however the disclosure is not limited thereto. In certain embodiments of which the technology node is N5 or beyond, the number of the sub-layers included in the capping layer 122 is one to five layers. In alternative embodiments (not shown), as the technology node is N7, N10, N16, N20 and so on (e.g. a larger critical dimension), the number of the sub-layers included in the capping layer 122 is more than five layers.

In some embodiments, materials of the sub-layers 122-1, 122-2 and 122-3 include the material of the capping layer 122 as aforementioned, and thus are not repeated herein. For example, the material of the capping layer 122 is a homogenous material throughout, where the materials of the sub-layers 122-1, 122-2 and 122-3 are identical to each other. The capping layer 122 may include a flat structure or a waving structure as substantially identical to or similar to the capping layer 120a described in FIG. 9 in conjunction with FIG. 10A and FIG. 10B; thus, are not repeated herein for brevity.

Figure 18:
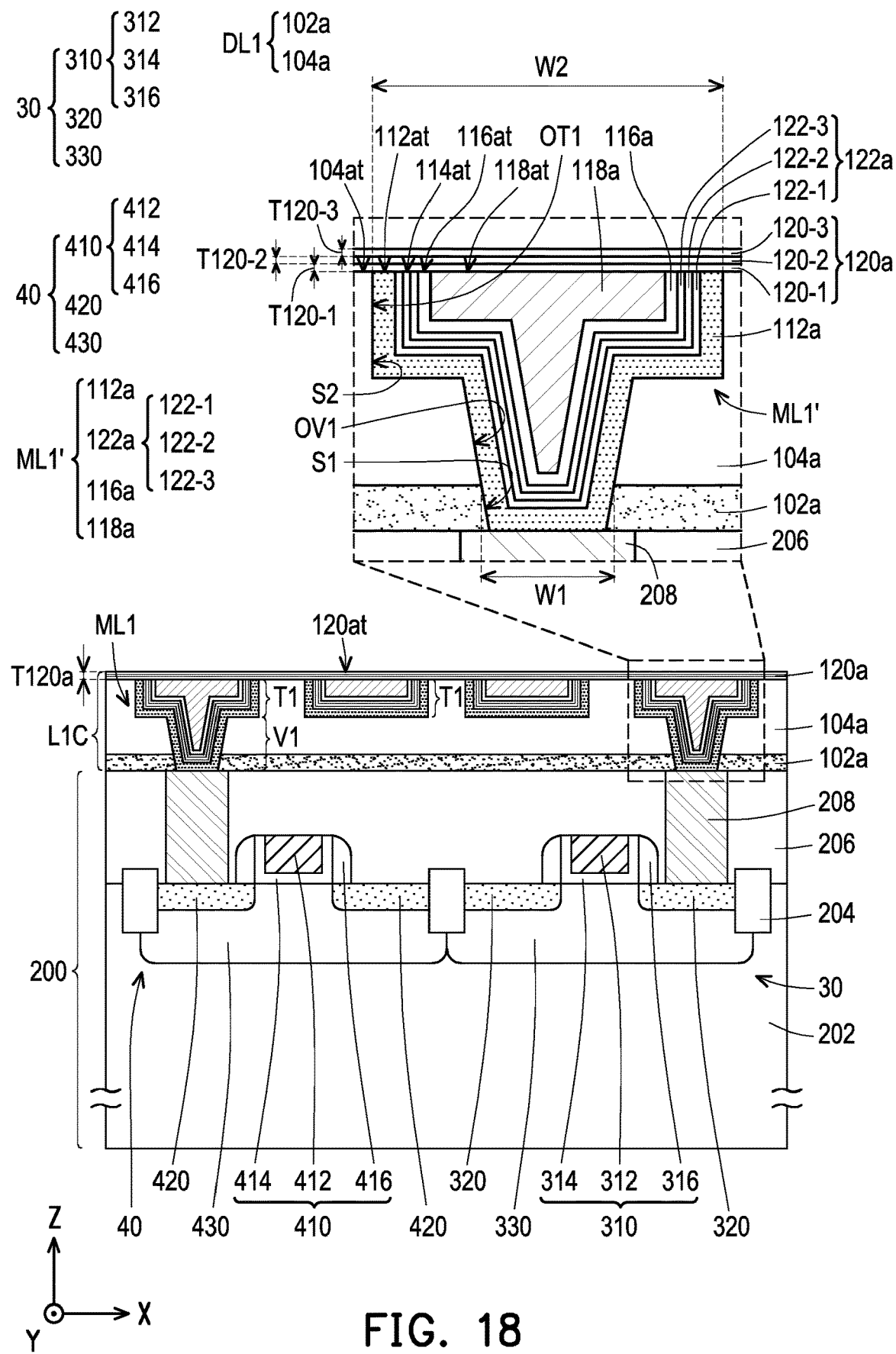

Referring to FIG. 18, in some embodiments, after the formation of the capping layer 122a, the processes of FIG. 6 through FIG. 9 are performed to form a barrier layer 112a, a capping layer 122a (including the sub-layers 122-1, 122-2 and 122-3), a seed layer 116a, a conductive feature 118a, and a capping layer 120a. For example, the barrier layer 112, the capping layer 122a, the seed layer 116a and the conductive feature 118a are collectively referred to as a metallization structure ML1' (or a metallization or conductive layer, or a metallization or conductive pattern), and the first dielectric layer 102a and the second dielectric layer 104a are collectively referred to as a dielectric structure DL1 (or a dielectric layer). For example, the metallization structure ML1' penetrates through the dielectric structure DL1 and is in contact with the conductive plugs 208 (e.g., the surfaces 208t). That is, the metallization structure ML1' is physically and electrically connected to the PMOS transistor 30 and the NMOS transistor 40 embedded in the substrate 200 through the conductive plugs 208, for example. In some embodiments, the metallization structure ML1' interconnects the (semiconductor) devices included in the substrate 200 for electrically communication therebetween. The metallization structure ML1' may be substantially coplanar with the dielectric structure DL1 at two opposite sides of the dielectric structure DL1 along the stacking direction Z. As shown in FIG. 18, the capping layer 120a may completely cover the illustrated top surfaces of the metallization structure ML1' and the dielectric structure DL1, where the illustrated top surface of the metallization structure ML1' may be leveled with and coplanar to the illustrated top surface of the dielectric structure DL1. However, the disclosure is not limited thereto. For example, the material of the capping layer 122a is the same as the material of the capping layer 120a. For example, the thickness of the capping layer 122a is the same as the thickness of the capping layer 120a.

Figure 19:
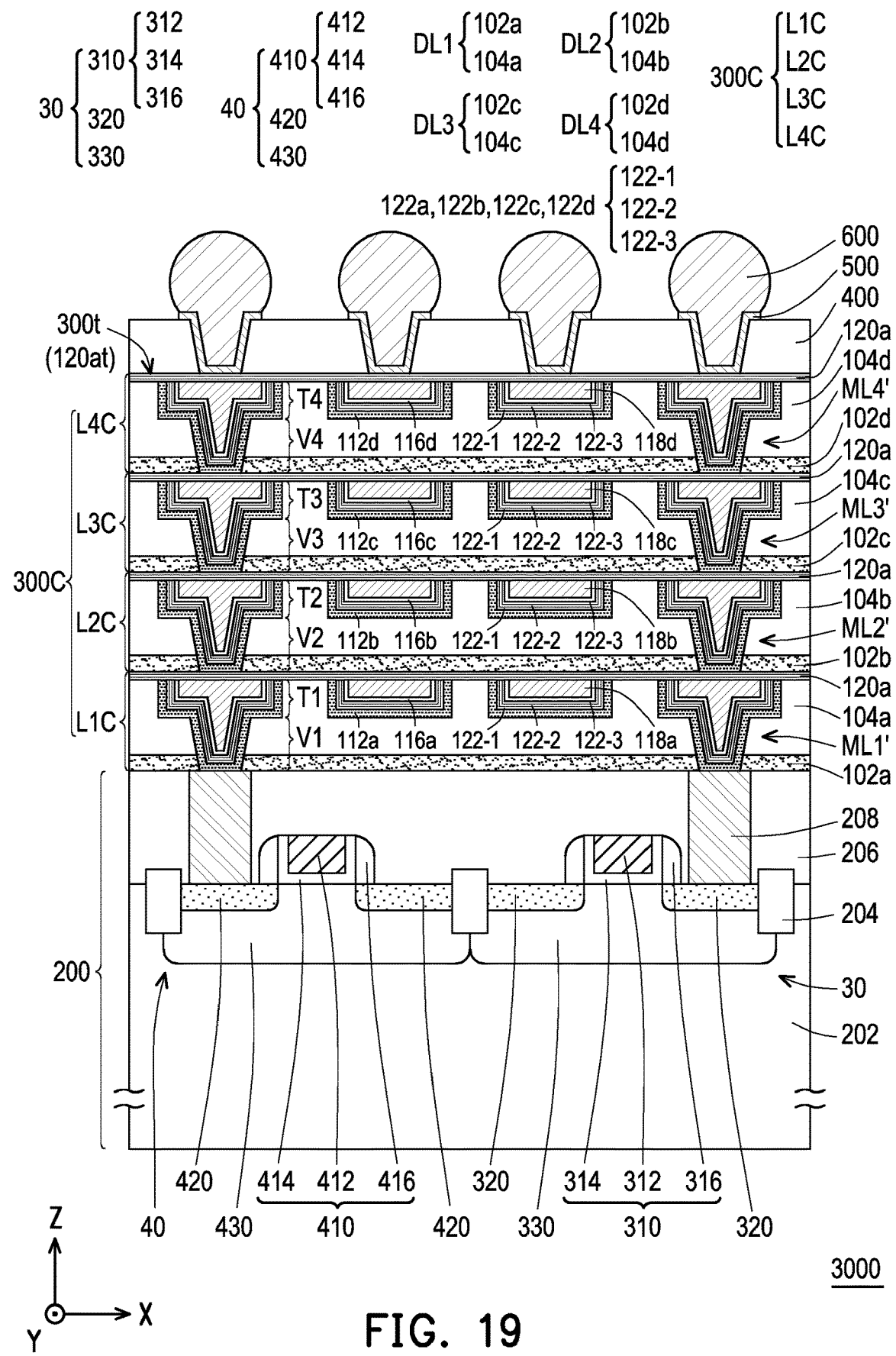

In some embodiments, the capping layer 120a, the metallization structure ML1' and the dielectric structure DL1 together constitute a build-up layer L1C included in an interconnect structure (e.g., an interconnect 300C of the semiconductor structure 3000 of FIG. 19). Owing to the capping layer 120a, the surface scattering effect occurred at the illustrate top surface of the metallization structure ML1' is suppressed, thereby improving the Rs (line resistance) performance. Owing to the capping layer 122a, the surface scattering effect occurred at a sidewall of the metallization structure ML1' is suppressed, thereby improving the Re (via resistance) performance. Therefore, the device performance of the semiconductor structure 3000 is enhanced. The details of the barrier layer 112a, the conductive feature 118a, and the capping layer 120a have been previously described in FIG. 6 through FIG. 9 in conjunction with FIG. 10A and FIG. 10B, and the details of the capping layer 122a are substantially identical to or similar to the details of the capping layer 122 as described in FIG. 17; thus, are not repeated herein for simplicity.

Referring to FIG. 19, in some embodiments, a build-up layer L2C, a build-up layer L3C and a build-up layer L4C are sequentially formed over the build-up layer L1C to form the interconnect 300C over the substrate 200. The interconnect 300C may be referred as an interconnect structure, a redistribution layer or a redistribution structure of the semiconductor structure 3000, which provides routing functions for the devices formed in the substrate 200 of the semiconductor structure 3000. Owing to the interconnect 300C, the devices formed in the substrate 200 can be electrically coupled and electrically communicated to each other and/or to external components.

The build-layer layer L2C is disposed on (e.g., in contact with) the build-layer layer L1C, as shown in FIG. 19. For example, the build-up layer L2C includes a dielectric structure DL2 (including a first dielectric layer 102b and a second dielectric layer 104b stacked thereon), a metallization structure ML2' (including a barrier layer 112b, a capping layer 122b, a seed layer 116b, and a conductive feature 118b), and a capping layer 120a covering the dielectric structure DL2 and the metallization structure ML2'. In some embodiments, the metallization structure ML2' penetrates through the dielectric structure DL2 to electrically couple to the metallization structure ML1' of the build-up layer L1C. In some embodiments, the dielectric structure DL2 and the metallization structure ML2' of the build-up layer L2C are sandwiched between the capping layer 120a of the build-up layer L2C and the capping layer 120a of the build-up layer L1C. Owing to the capping layer 120a, the surface scattering effect occurred at illustrate top and bottom surfaces of the metallization structure ML2' is suppressed, thereby improving the Rs (line resistance) performance. Owing to the capping layer 122b, the surface scattering effect occurred at a sidewall of the metallization structure ML2' is suppressed, thereby improving the Re (via resistance) performance. The device performance of the semiconductor structure 3000 is enhanced. The formation and material of the first dielectric layer 102b, the second dielectric layer 104b, the barrier layer 112b, the seed layer 116b, and the conductive feature 118b are substantially identical to or similar to the process and material of forming the first dielectric layer 102a, the second dielectric layer 104a, the barrier layer 112a, the liner layer 114a, the seed layer 116a, and the conductive feature 118a as described in FIG. 1 through FIG. 7, the details of the capping layer 122b are substantially identical to or similar to the details of the capping layer 122a as described in FIG. 16 through FIG. 18, and the details of the capping layer 120a have been previously described in FIG. 8 and FIG. 9 in conjunction with FIG. 10A and FIG. 10B; thus, are not repeated herein for brevity. For example, the material of the capping layer 122b is the same as the material of the capping layer 120a. For example, the thickness of the capping layer 122b is the same as the thickness of the capping layer 120a.

The build-layer layer L3C is disposed on (e.g., in contact with) the build-layer layer L2C, as shown in FIG. 19. For example, the build-up layer L3C includes a dielectric structure DL3 (including a first dielectric layer 102c and a second dielectric layer 104c stacked thereon), a metallization structure ML3' (including a barrier layer 112c, a capping layer 122c, a seed layer 116c, and a conductive feature 118c), and a capping layer 120a covering the dielectric structure DL3 and the metallization structure ML3'. In some embodiments, the metallization structure ML3' penetrates through the dielectric structure DL3 to electrically couple to the metallization structure ML2' of the build-up layer L2C. In some embodiments, the dielectric structure DL3 and the metallization structure ML3' of the build-up layer L3C are sandwiched between the capping layer 120a of the build-up layer L3C and the capping layer 120a of the build-up layer L2C. Owing to the capping layer 120a, the surface scattering effect occurred at illustrate top and bottom surfaces of the metallization structure ML3' is suppressed, thereby improving the Rs (line resistance) performance. Owing to the capping layer 122c, the surface scattering effect occurred at a sidewall of the metallization structure ML3' is suppressed, thereby improving the Re (via resistance) performance. The device performance of the semiconductor structure 3000 is enhanced. The formation and material of the first dielectric layer 102c, the second dielectric layer 104c, the barrier layer 112c, the seed layer 116c, and the conductive feature 118c are substantially identical to or similar to the process and material of forming the first dielectric layer 102a, the second dielectric layer 104a, the barrier layer 112a, the liner layer 114a, the seed layer 116a, and the conductive feature 118a as described in FIG. 1 through FIG. 7, the details of the capping layer 122c are substantially identical to or similar to the details of the capping layer 122a have been previously described in FIG. 16 through FIG. 18, and the details of the capping layer 120a have been previously described in FIG. 8 and FIG. 9 in conjunction with FIG. 10A and FIG. 10B; thus, are not repeated herein for brevity. For example, the material of the capping layer 122c is the same as the material of the capping layer 120a. For example, the thickness of the capping layer 122c is the same as the thickness of the capping layer 120a.

The build-layer layer L4C is disposed on (e.g., in contact with) the build-layer layer L3C, as shown in FIG. 19. For example, the build-up layer L4C includes a dielectric structure DL4 (including a first dielectric layer 102d and a second dielectric layer 104d stacked thereon), a metallization structure ML4' (including a barrier layer 112d, a capping layer 122d, a seed layer 116d, and a conductive feature 118d), and a capping layer 120a covering the dielectric structure DL4 and the metallization structure ML4'. In some embodiments, the metallization structure ML4' penetrates through the dielectric structure DL4 to electrically couple to the metallization structure ML3' of the build-up layer L3C. In some embodiments, the dielectric structure DL4 and the metallization structure ML4' of the build-up layer L4C are sandwiched between the capping layer 120a of the build-up layer L4C and the capping layer 120a of the build-up layer L3C. Owing to the capping layer 120a, the surface scattering effect occurred at illustrate top and bottom surfaces of the metallization structure ML4' is suppressed, thereby improving the Rs (line resistance) performance. Owing to the capping layer 122d, the surface scattering effect occurred at a sidewall of the metallization structure ML4' is suppressed, thereby improving the Re (via resistance) performance. The device performance of the semiconductor structure 3000 is enhanced. The formation and material of the first dielectric layer 102d, the second dielectric layer 104d, the barrier layer 112d, the seed layer 116d, and the conductive feature 118d are substantially identical to or similar to the process and material of forming the first dielectric layer 102a, the second dielectric layer 104a, the barrier layer 112a, the liner layer 114a, the seed layer 116a, and the conductive feature 118a as described in FIG. 1 through FIG. 7, the details of the capping layer 122d are substantially identical to or similar to the details of the capping layer 122a have been previously described in FIG. 16 through FIG. 18, and the details of the capping layer 120a have been previously described in FIG. 8 and FIG. 9 in conjunction with FIG. 10A and FIG. 10B; thus, are not repeated herein for brevity. For example, the material of the capping layer 122d is the same as the material of the capping layer 120a. For example, the thickness of the capping layer 122d is the same as the thickness of the capping layer 120a. In some embodiments, the capping layer 122a, 122b, 122c, and 122d independently are referred to as a capping liner or a capping liner layer.

For illustration purpose, four build-up layers are included in the interconnect 300C of FIG. 19; however, the disclosure is not limited thereto. The number of the build-up layer included in the interconnect 300C is not limited in the disclosure, and may be selected based on the demand and design layout. That is, the number of the build-up layer included in the interconnect 300C may be one or more than one as long as the interconnect 300C can provide a sufficient routing function to the devices (e.g., 30 and/or 40) included in the substrate 200.

In some embodiments, after forming the interconnect 300C, the process of FIG. 12 is performed to sequentially form a passivation layer 400, a plurality of UBM patterns 500 and a plurality of conductive terminals 600 over the interconnect 300C. Up to here, the semiconductor structure 3000 is manufactured. In some embodiments, the passivation layer 400 is disposed on (e.g., in contact with) an outermost surface 300t (including a surface 120at) of the interconnect 300C. In some embodiments, the UBM patterns 500 penetrate through the passivation layer 400 to electrically couple the metallization structure ML4' of the build-up layer L4C. In some embodiments, the conductive terminals 600 are disposed over the UBM patterns 500 to electrically couple the metallization structure ML4' of the build-up layer L4C through the UBM patterns 500. Due to the UBM patterns 500, the adhesion between the conductive terminals 600 and the interconnect 300C is enhanced. For example, at least some of the conductive terminals 600 are electrically connected to the devices (e.g. 30 and/40) included in the substrate 200 through the interconnect 300C. However, the disclosure is not limited thereto; alternatively, the UBM patterns 500 may be omitted based on the design layout and demand.

Figure 20:
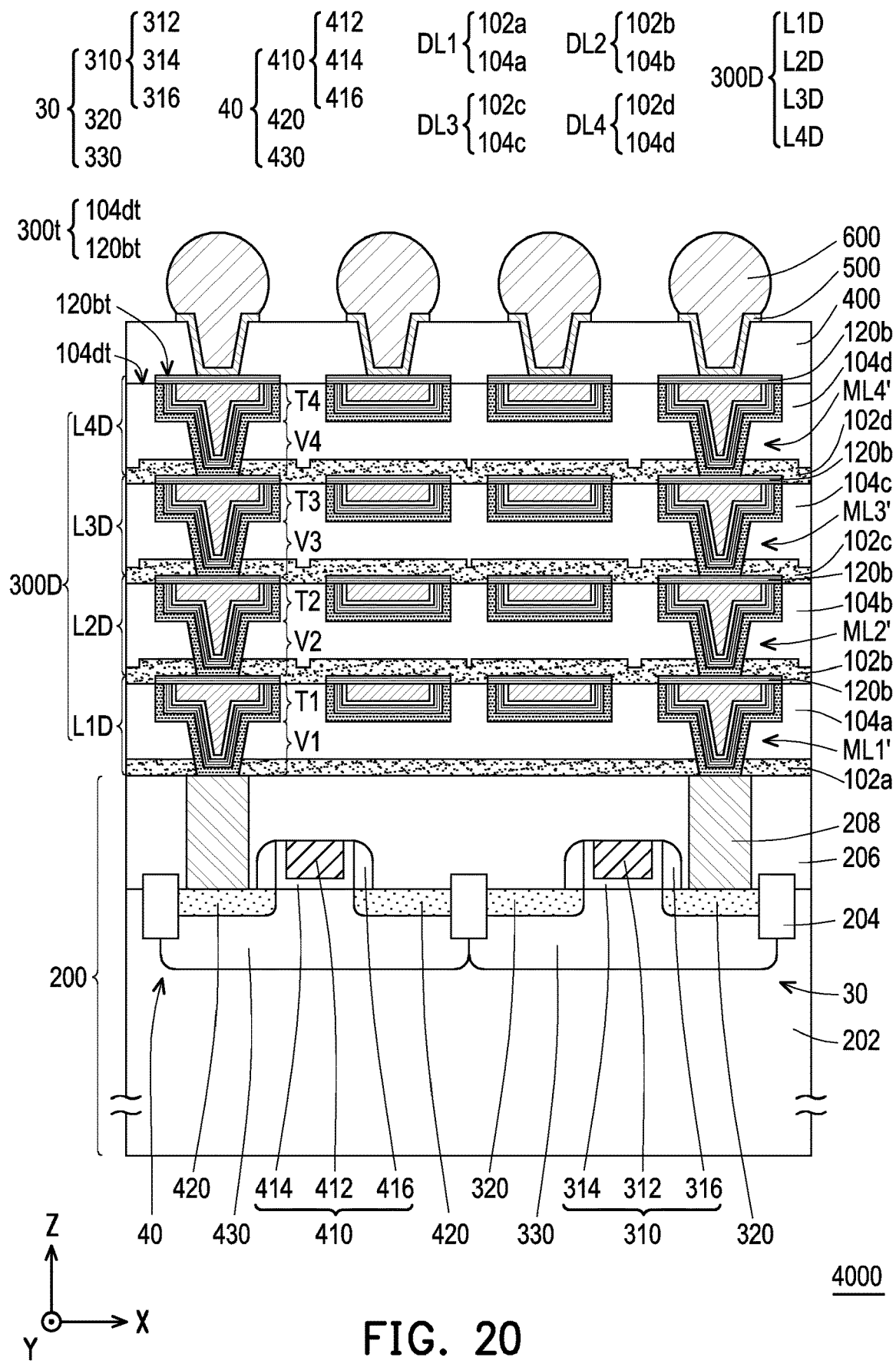
FIG. 20 is a schematic cross-sectional view of a semiconductor structure in accordance with some alternative embodiments of the disclosure.

FIG. 20 is a schematic cross-sectional view of a semiconductor structure in accordance with some alternative embodiments of the disclosure. The elements similar to or substantially the same as the elements described previously will use the same reference numbers, and certain details or descriptions (e.g. the materials, formation processes, positioning configurations, electrical connections, etc.) of the same elements would not be repeated herein. In some embodiments, the semiconductor structure 4000 of FIG. 20 and the semiconductor structure 3000 of FIG. 19 are similar; and the difference is that, the semiconductor structure 4000 substitutes the interconnect 300C with an interconnect 300D.

In some embodiments, the interconnect 300D includes a build-up layer L1D, a build-up layer L2D, a build-up layer L3D and a build-up layer L4D. The interconnect 300D may be referred as an interconnect structure, a redistribution layer or a redistribution structure of the semiconductor structure 4000, which provides routing functions for the devices formed in the substrate 200 of the semiconductor structure 4000. Owing to the interconnect 300D, the devices formed in the substrate 200 can be electrically coupled and electrically communicated to each other and/or to external components. In some embodiments, the build-up layer L1D, the build-up layer L2D, the build-up layer L3D and the build-up layer L4D of the interconnect 300D in FIG. 20 are similar to the build-up layer L1C, the build-up layer L2C, the build-up layer L3C and the build-up layer L4C of the interconnect 300C in FIG. 19, the difference is that, in each of the build-up layer L1D, the build-up layer L2D, the build-up layer L3D and the build-up layer L4D, the capping layer 120a is substituted by a capping layer 120b. The details of the capping layer 120b have been previously described in FIG. 13 and FIG. 14; thus, are not repeated herein for brevity. For example, the material of each of the capping layers 122a, 122b, 122c and 122d is the same as the material of the capping layer 120b. For example, the thickness of each of the capping layers 122a, 122b, 122c and 122d is the same as the thickness of the capping layer 120b. Owing to the capping layers 120b, the surface scattering effect occurred at illustrate top and bottom surfaces of the metallization structures ML1', ML2', ML3' and ML4' is still suppressed, thereby improving the Rs (line resistance) performance. Owing to the capping layers 122a-122d, the surface scattering effect occurred at the sidewalls of the metallization structures ML1', ML2', ML3' and ML4' is suppressed, thereby improving the Re (via resistance) performance. The device performance of the semiconductor structure 4000 is enhanced.

Figure 21:
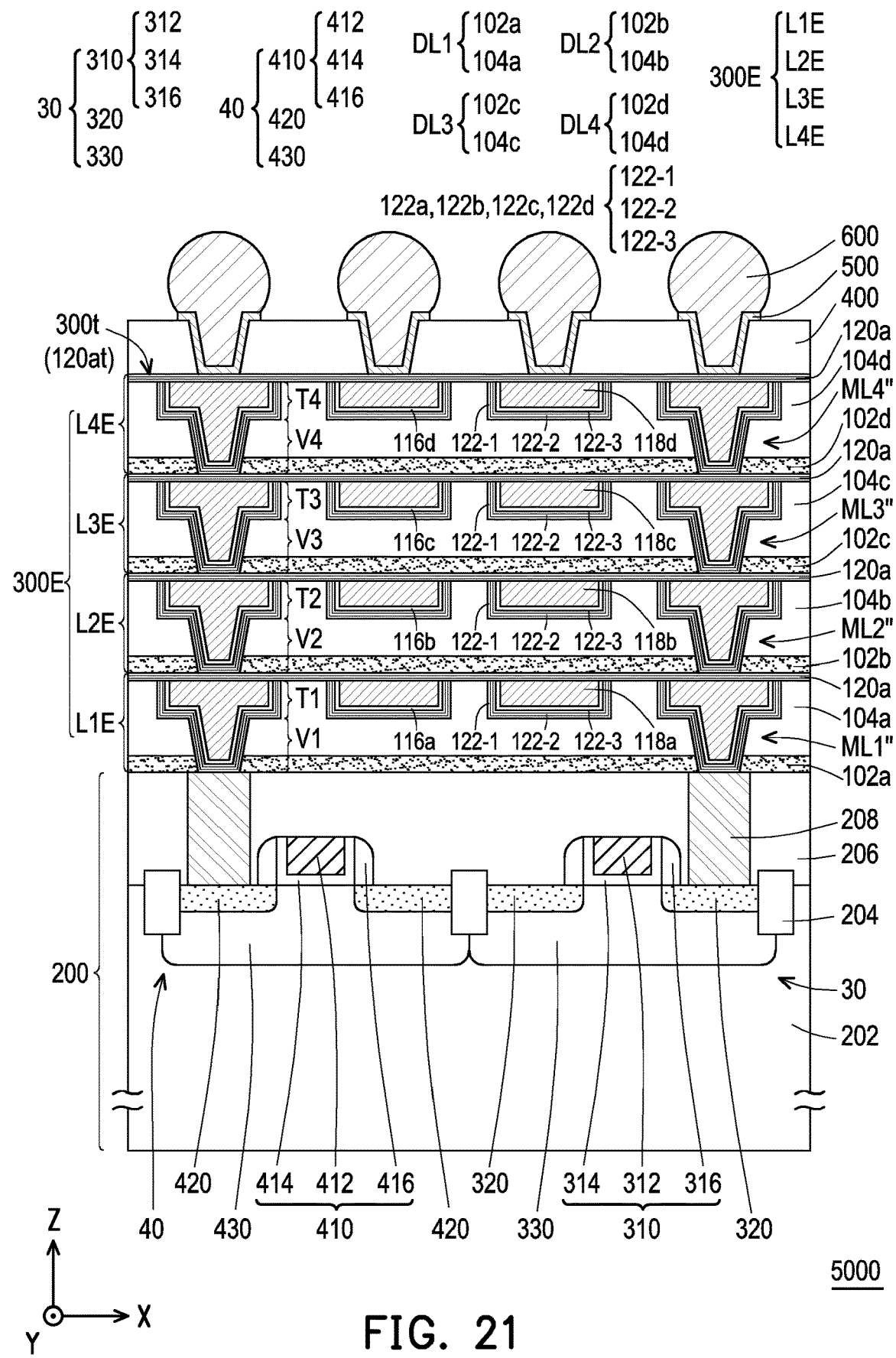
FIG. 21 is a schematic cross-sectional view of a semiconductor structure in accordance with some alternative embodiments of the disclosure.

FIG. 21 is a schematic cross-sectional view of a semiconductor structure in accordance with some alternative embodiments of the disclosure. The elements similar to or substantially the same as the elements described previously will use the same reference numbers, and certain details or descriptions (e.g. the materials, formation processes, positioning configurations, electrical connections, etc.) of the same elements would not be repeated herein. In some embodiments, the semiconductor structure 5000 of FIG. 21 and the semiconductor structure 3000 of FIG. 19 are similar; and the difference is that, the semiconductor structure 5000 substitutes the interconnect 300C with an interconnect 300E.

In some embodiments, the interconnect 300E includes a build-up layer L1E, a build-up layer L2E, a build-up layer L3E and a build-up layer L4E. As shown in FIG. 21, the build-up layer L1E, the build-up layer L2E, the build-up layer L3E and the build-up layer L4E are electrically coupled to each other and are stacked over the substrate 200 in order. The interconnect 300E may be referred as an interconnect structure, a redistribution layer or a redistribution structure of the semiconductor structure 5000, which provides routing functions for the devices formed in the substrate 200 of the semiconductor structure 5000. Owing to the interconnect 300E, the devices formed in the substrate 200 can be electrically coupled and electrically communicated to each other and/or to external components. In some embodiments, the build-up layer L1E, the build-up layer L2E, the build-up layer L3E and the build-up layer L4E of the interconnect 300E in FIG. 21 are similar to the build-up layer L1C, the build-up layer L2C, the build-up layer L3C and the build-up layer L4C of the interconnect 300C in FIG. 19, the difference is that, there is no barrier layers 112a, 112b, 112c, 112d in interconnect 300E.

In some embodiments, a capping layer 120a, a metallization structure ML1" and a dielectric structure DL1 together constitute the build-up layer L1E, where the metallization structure ML1" includes a capping layer 122a, a seed layer 116a and a conductive feature 118a, and the dielectric structure DL1 includes a first dielectric layer 102a and a second dielectric layer 104a. As shown in FIG. 21, the capping layer 120a may cover illustrated top surfaces of the metallization structure ML1" and the dielectric structure DL1, where the illustrated top surfaces of the metallization structure ML1" and the dielectric structure DL1 may be leveled with and coplanar to each other. Owing to the capping layers 120a and 122a, the surface scattering effect occurred at the illustrate top surface and a sidewall of the metallization structure ML1" is suppressed, thereby improving the Rs (line resistance) and Re (via resistance) performances. With the omission of the barrier layer 112a in the openings O3, an overall volume of the conductive feature 118a occupying in the openings O3 is increased, thereby decreasing the resistance of the conductive feature 118a included in the metallization structure ML1" and thus further improving the Rs (line resistance) performance. The device performance of the semiconductor structure 5000 is enhanced. The formation and material of the first dielectric layer 102a, the second dielectric layer 104a, the seed layer 116a, and the conductive feature 118a have been previously described in FIG. 1 through FIG. 7, the details of the capping layer 122a have been previously described in FIG. 16 through FIG. 18, and the details of the capping layer 120a have been previously described in FIG. 8 and FIG. 9 in conjunction with FIG. 10A and FIG. 10B; thus, are not repeated herein for brevity.

In some embodiments, a capping layer 120a, a metallization structure ML2" and a dielectric structure DL2 together constitute the build-up layer L2E, where the metallization structure ML2" includes a capping layer 122b, a seed layer 116b and a conductive feature 118b, and the dielectric structure DL2 includes a first dielectric layer 102b and a second dielectric layer 104b. As shown in FIG. 21, the capping layer 120a may cover illustrated top surfaces of the metallization structure ML2" and the dielectric structure DL2, where the illustrated top surfaces of the metallization structure ML2" and the dielectric structure DL2 may be leveled with and coplanar to each other. Owing to the capping layers 120a and 122b, the surface scattering effect occurred at illustrate top and bottom surfaces and a sidewall of the metallization structure ML2" is suppressed, thereby improving the Rs (line resistance) and Re (via resistance) performances. With the omission of the barrier layer 112b, an overall volume of the conductive feature 118b is increased, thereby decreasing the resistance of the conductive feature 118b included in the metallization structure ML2" and thus further improving the Rs (line resistance) performance. The device performance of the semiconductor structure 5000 is enhanced. The formation and material of the first dielectric layer 102b, the second dielectric layer 104b, the seed layer 116b, and the conductive feature 118b have been previously described in FIG. 1 through FIG. 7, the details of the capping layer 122b have been previously described in FIG. 19, and the details of the capping layer 120a have been previously described in FIG. 8 and FIG. 9 in conjunction with FIG. 10A and FIG. 10B; thus, are not repeated herein for brevity.

In some embodiments, a capping layer 120a, a metallization structure ML3" and a dielectric structure DL3 together constitute the build-up layer L3E, where the metallization structure ML3" includes a capping layer 122c, a seed layer 116c and a conductive feature 118c, and the dielectric structure DL3 includes a first dielectric layer 102c and a second dielectric layer 104c. As shown in FIG. 21, the capping layer 120a may cover illustrated top surfaces of the metallization structure ML3" and the dielectric structure DL3, where the illustrated top surfaces of the metallization structure ML3" and the dielectric structure DL3 may be leveled with and coplanar to each other. Owing to the capping layers 120a and 122c, the surface scattering effect occurred at illustrate top and bottom surfaces and a sidewall of the metallization structure ML3" is suppressed, thereby improving the Rs (line resistance) and Rc (via resistance) performances. With the omission of the barrier layer 112e, an overall volume of the conductive feature 118e is increased, thereby decreasing the resistance of the conductive feature 118c included in the metallization structure ML3" and thus further improving the Rs (line resistance) performance. The device performance of the semiconductor structure 5000 is enhanced. The formation and material of the first dielectric layer 102c, the second dielectric layer 104c, the seed layer 116c, and the conductive feature 118c have been previously described in FIG. 1 through FIG. 7, the details of the capping layer 122c have been previously described in FIG. 19, and the details of the capping layer 120a have been previously described in FIG. 8 and FIG. 9 in conjunction with FIG. 10A and FIG. 10B; thus, are not repeated herein for brevity.

In some embodiments, a capping layer 120a, a metallization structure ML4" and a dielectric structure DL4 together constitute the build-up layer L4E, where the metallization structure ML4" includes a capping layer 122d, a seed layer 116d and a conductive feature 118d, and the dielectric structure DL4 includes a first dielectric layer 102d and a second dielectric layer 104d. As shown in FIG. 21, the capping layer 120a may cover illustrated top surfaces of the metallization structure ML4" and the dielectric structure DL4, where the illustrated top surfaces of the metallization structure ML4" and the dielectric structure DL4 may be leveled with and coplanar to each other. Owing to the capping layers 120a and 122d, the surface scattering effect occurred at illustrate top and bottom surfaces and a sidewall of the metallization structure ML4" is suppressed, thereby improving the Rs (line resistance) and Rc (via resistance) performances. With the omission of the barrier layer 112d, an overall volume of the conductive feature 118d is increased, thereby decreasing the resistance of the conductive feature 118d included in the metallization structure ML4" and thus further improving the Rs (line resistance) performance. The device performance of the semiconductor structure 5000 is enhanced. The formation and material of the first dielectric layer 102d, the second dielectric layer 104d, the seed layer 116d, and the conductive feature 118d have been previously described in FIG. 1 through FIG. 7, the details of the capping layer 122d have been previously described in FIG. 19, and the details of the capping layer 120a have been previously described in FIG. 8 and FIG. 9 in conjunction with FIG. 10A and FIG. 10B; thus, are not repeated herein for brevity. For example, the material of each of the capping layers 122a, 122b, 122c and 122d is the same as the material of the capping layer 120a. For example, the thickness of each of the capping layers 122a, 122b, 122c and 122d is the same as the thickness of the capping layer 120a.

For illustration purpose, four build-up layers are included in the interconnect 300E of FIG. 21; however, the disclosure is not limited thereto. The number of the build-up layer included in the interconnect 300E is not limited in the disclosure, and may be selected based on the demand and design layout. That is, the number of the build-up layer included in the interconnect 300E may be one or more than one as long as the interconnect 300E can provide a sufficient routing function to the devices (e.g., 30 and/or 40) included in the substrate 200.

Figure 22:
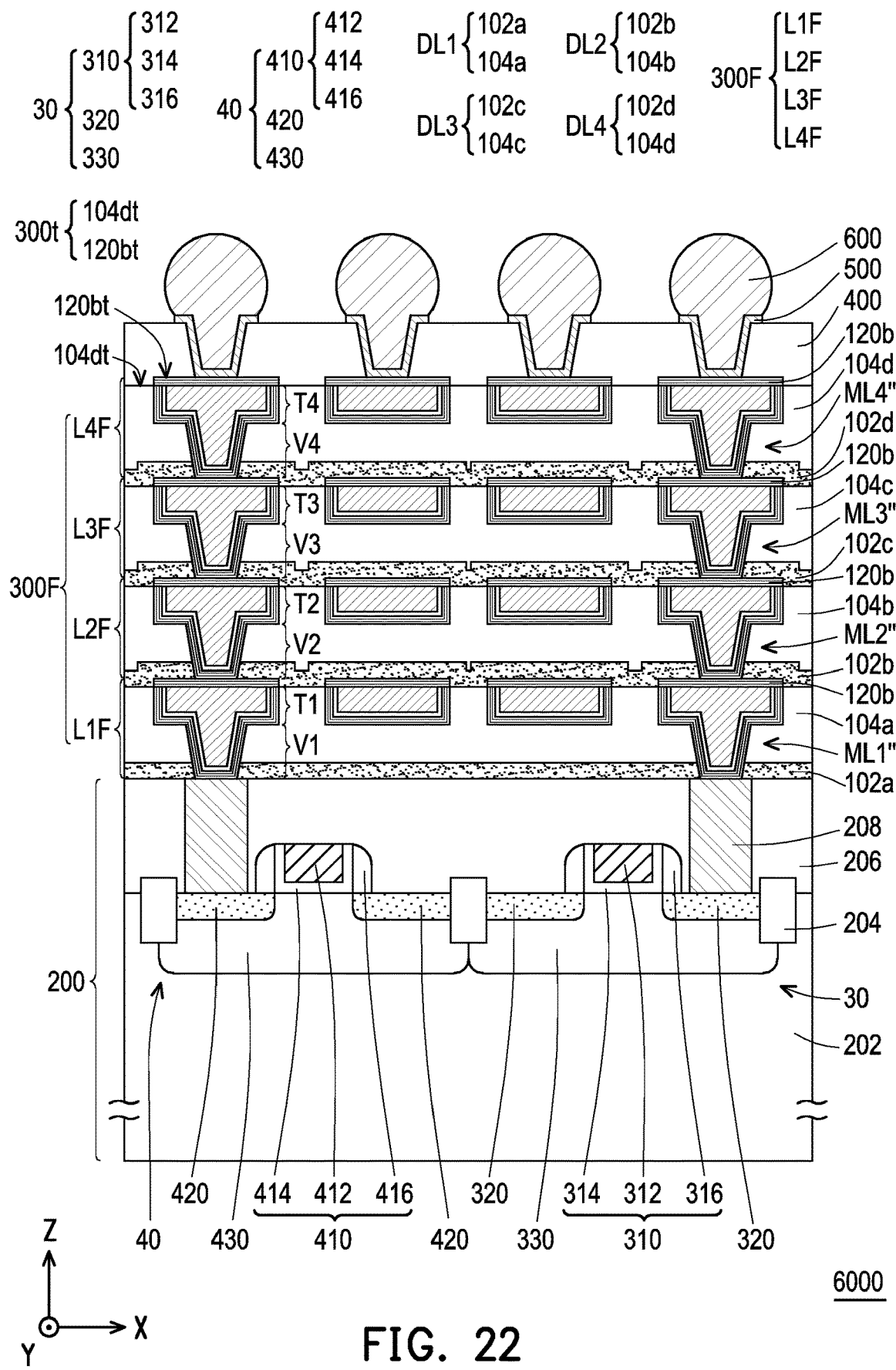
FIG. 22 is a schematic cross-sectional view of a semiconductor structure in accordance with some alternative embodiments of the disclosure.

FIG. 22 is a schematic cross-sectional view of a semiconductor structure in accordance with some alternative embodiments of the disclosure. The elements similar to or substantially the same as the elements described previously will use the same reference numbers, and certain details or descriptions (e.g. the materials, formation processes, positioning configurations, electrical connections, etc.) of the same elements would not be repeated herein. In some embodiments, the semiconductor structure 6000 of FIG. 22 and the semiconductor structure 5000 of FIG. 21 are similar; and the difference is that, the semiconductor structure 6000 substitutes the interconnect 300E with an interconnect 300F.

In some embodiments, the interconnect 300F includes a build-up layer L1F, a build-up layer L2F, a build-up layer L3F and a build-up layer L4F. The interconnect 300F may be referred as an interconnect structure, a redistribution layer or a redistribution structure of the semiconductor structure 6000, which provides routing functions for the devices formed in the substrate 200 of the semiconductor structure 6000. Owing to the interconnect 300F, the devices formed in the substrate 200 can be electrically coupled and electrically communicated to each other and/or to external components. In some embodiments, the build-up layer L1F, the build-up layer L2F, the build-up layer L3F and the build-up layer L4F of the interconnect 300F in FIG. 22 are similar to the build-up layer L1E, the build-up layer L2E, the build-up layer L3E and the build-up layer L4E of the interconnect 300E in FIG. 21, the difference is that, in each of the build-up layer L1F, the build-up layer L2F, the build-up layer L3F and the build-up layer L4F, the capping layer 120a is substituted by a capping layer 120b. The details of the capping layer 120b have been previously described in FIG. 13 and FIG. 14; thus, are not repeated herein for brevity. For example, the material of each of the capping layers 122a, 122b, 122c and 122d is the same as the material of the capping layer 120b. For example, the thickness of each of the capping layers 122a, 122b, 122c and 122d is the same as the thickness of the capping layer 120b. Owing to the capping layers 120b, the surface scattering effect occurred at illustrate top and bottom surfaces of the metallization structures ML1", ML2", ML3" and ML4" is still suppressed, thereby improving the Rs (line resistance) performance. Owing to the capping layers 122a-122d, the surface scattering effect occurred at the sidewalls of the metallization structures ML1", ML2", ML3" and ML4" is suppressed, thereby improving the Re (via resistance) performance. The device performance of the semiconductor structure 6000 is enhanced.

Figure 23:
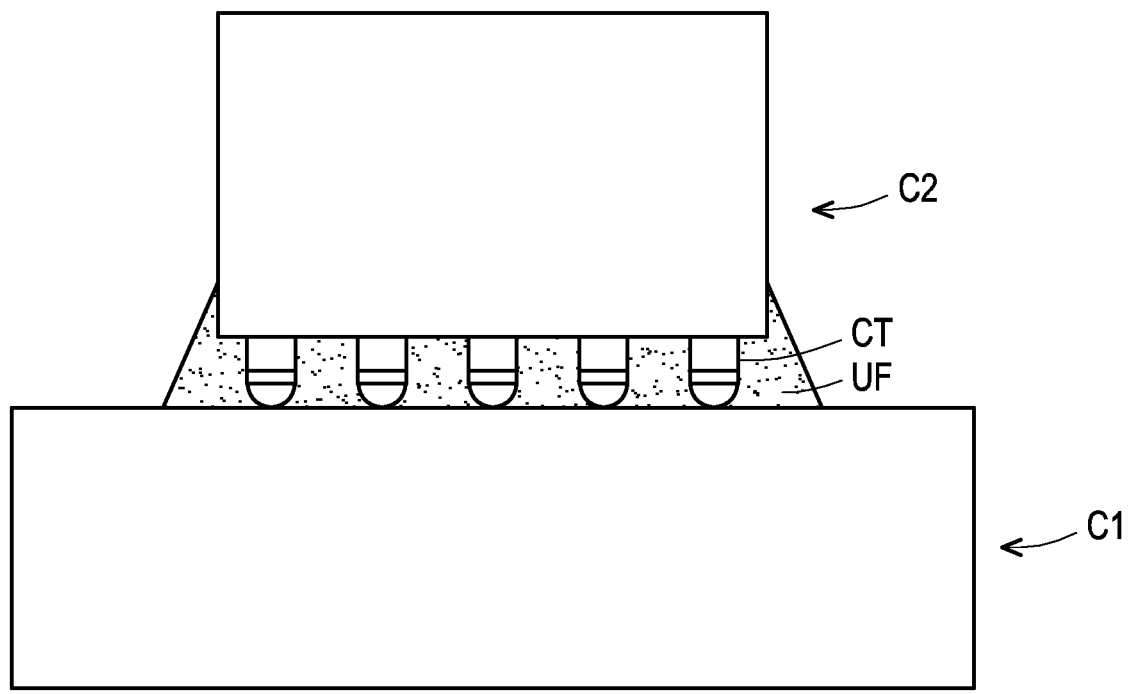
FIG. 23 is a schematic cross-sectional view showing an application of a semiconductor structure in accordance with some embodiments of the disclosure.

FIG. 23 is a schematic cross-sectional view showing an application of a semiconductor structure in accordance with some embodiments of the disclosure. The elements similar to or substantially the same as the elements described previously will use the same reference numbers, and certain details or descriptions (e.g. the materials, formation processes, positioning configurations, electrical connections, etc.) of the same elements would not be repeated herein. Referring to FIG. 23, in some embodiments, a component assembly SC including a first component C1 and a second component C2 disposed over the first component C1 is provided. The first component C1 may be or may include a circuit structure, such as a mother board, a package substrate, another printed circuit board (PCB), a printed wiring board, an interposer, and/or other carrier that is capable of carrying integrated circuits. In some embodiments, the second component C2 mounted on the first component C1 is similar to one of the semiconductor structures 1000, 2000, 3000, 4000, 5000, and 60. For example, one or more the semiconductor structures (e.g., 1000, 2000, 3000, 4000, 5000, and 6000) may be electrically coupled to the first component C1 through a plurality of terminals CT. The terminals CT may be the conductive terminals 600 as described in FIG. 12, FIG. 15, FIG. 19, FIG. 20, FIG. 21, and FIG. 22.

In some embodiments, an underfill UF is formed between the gap of the first component C1 and the second component C2 to at least laterally cover the terminals CT. Alternatively, the underfill UF is omitted. The underfill UF may be any acceptable material, such as a polymer, epoxy resin, molding underfill, or the like, for example. In one embodiment, the underfill may be formed by underfill dispensing, a capillary flow process, or any other suitable method. Owing to the underfill UF, a bonding strength between the first component C1 and the second component C2 is enhanced.

Besides, the capping layer and/or the additional capping layer can further adopted to an integrated Fan-Out (InFO) package, an InFO package having a Package-on-Package (PoP) structure, a chip-on-wafer-on-substrate (CoWoS) package, a flip chip package of an InFO package, or the like, a metallic feature (such as a through-insulator-via, a through-molding-via, a through-dielectric-via, a through-substrate-via, a metallic line/wire/via) included therein is covered by the capping layer and/or the additional capping layer of the disclosure for suppressing the surface scattering effect and thus reducing the resistivity, thereby improving the performance thereof.

In above embodiments, the capping layers 120a, 120b, 122 are formed in a two-step process. However, the disclosure is not limited thereto; alternatively, the capping layers 120a, 120b, 122 may be directly formed in one-step process, such as directly through ALD process or CVD process. In the embodiments of which the capping layers 120a, 120b, 122 is a $TaS_2$ being formed in the one-step process, the tantalum precursor includes tantalum dimethylamide (PDMAT), tantalum ethoxide, tantalum chloride, or a combination thereof, while the sulfur precursor includes DMDS or $H_2S$.

In above embodiments, the line portion and the via portion of each of the metallization layers of the disclosure may be formed by a dual damascene process, e.g., in one step. However, the disclosure is not limited thereto. Alternatively, the line portion and the via portion of each of the metallization layers of the disclosure may be formed in different steps, where the trench portion and the via portion may independently formed with or without a capping liner. For example, the sub-layers of the capping liner for the line portion and the respective one via portion are different. A number of sub-layers of the capping liner for the line portion may be less than a number of sub-layers of the capping liner for the respective one via portion. A number of sub-layers of the capping liner for the line portion may be greater than a number of sub-layers of the capping liner for the respective one via portion. For example, the sub-layers of the capping liner for the line portion and the respective one via portion are the same. A number of sub-layers of the capping liner for the line portion may be equal to a number of sub-layers of the capping liner for the respective one via portion.

In accordance with some embodiments, a semiconductor structure includes a substrate and an interconnect. The substrate has a semiconductor device. The interconnect is disposed over the substrate and electrically coupled to the semiconductor device, and includes a metallization layer and a capping layer. The metallization layer is disposed over the substrate and includes a via portion and a line portion connecting to the via portion. The capping layer covers the line portion, where the line portion is sandwiched between the via portion and the capping layer, and the capping layer includes a plurality of sub-layers.

In accordance with some embodiments, a semiconductor structure includes a substrate and an interconnect structure. The substrate has a semiconductor device. The interconnect structure is disposed over the substrate and electrically coupled to the semiconductor device, and includes a dielectric structure, a conductive structure, a first capping layer, and a second capping layer. The conductive structure is disposed in the dielectric structure. The first capping layer is disposed between the dielectric structure and the conductive structure, and the first capping layer has a first layered structure. The second capping layer is disposed over the conductive structure, and the second capping layer has a second layered structure.

In accordance with some embodiments, a method of manufacturing a semiconductor structure includes the following steps: providing a substrate having a semiconductor device; and forming an interconnect over the substrate, the interconnect being electrically coupled to the semiconductor device, wherein forming the interconnect comprises: disposing, over the substrate, a metallization layer comprising a via portion and a line portion connecting to the via portion; forming a first capping material over the line portion of the metallization layer; and performing a thermal treatment on the first capping material to form a first capping layer having a plurality of first sub-layers over the metallization layer, the first capping layer covering the line portion, and the line portion being sandwiched between the via portion and the first capping layer.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A semiconductor structure, comprising:
  a substrate having a semiconductor device; and
  an interconnect, disposed over the substrate and electrically coupled to the semiconductor device, comprising:

a metallization layer, disposed over the substrate, and comprising a via portion and a line portion connecting to the via portion;

a capping layer, covering the line portion, wherein the line portion is sandwiched between the via portion and the capping layer, and the capping layer comprises a plurality of sub-layers; and a dielectric layer, laterally covering the metallization layer, wherein:

the plurality of sub-layers independently comprise a material comprising $MX_{n1}$, wherein M is a transition metal selected from the groups IVB, VB, or VIB of the periodic table, X is an element selected from a group consisting of sulfur, selenium, and tellurium, and n1 is in a range of 0.5-2, or the plurality of sub-layers independently comprise a material comprising $Ta_{n2}S_{n3}$, wherein n2 is in a range of 1-2, and n3 is in a range of 2-5.

2. The semiconductor structure of claim 1, wherein a surface of the dielectric layer is substantially coplanar with a surface of the line portion, and the capping layer is disposed on the surface of the line portion.

3. The semiconductor structure of claim 2, wherein the capping layer is further extended onto the surface of the dielectric layer.

4. A semiconductor structure, comprising:
a substrate having a semiconductor device; and
an interconnect structure, disposed over the substrate and electrically coupled to the semiconductor device, comprising:
a dielectric structure;
a conductive structure, disposed in the dielectric structure, wherein a surface of the dielectric structure being coplanar with a surface of the conductive structure;
a first capping layer, disposed between the dielectric structure and the conductive structure, the first capping layer having a first layered structure; and
a second capping layer, disposed over the conductive structure, the second capping layer having a second layered structure.

5. The semiconductor structure of claim 4, wherein a sidewall and a bottom of the conductive structure disposed in the dielectric structure are lined with the first capping layer, and the conductive structure is enclosed by the first capping layer and the second capping layer.

6. The semiconductor structure of claim 4, wherein a material of the first layered structure of the first capping layer and a material of the second layered structure of the second capping layer are the same.

7. The semiconductor structure of claim 4, wherein the second capping layer further extends onto the surface of the dielectric structure being coplanar with the surface of the conductive structure.

8. The semiconductor structure of claim 4, wherein the interconnect structure further comprises:
a barrier layer, interposed between the first capping layer and the dielectric structure, wherein a surface of the first capping layer and a surface of the barrier layer are substantially coplanar to the surface of the dielectric structure and the surface of the conductive structure, wherein the second capping layer is disposed on the surface of the conductive structure, the surface of the first capping layer, and the surface of the barrier layer.

9. The semiconductor structure of claim 8, wherein the second capping layer further extends onto the surface of the dielectric structure.

10. The semiconductor structure of claim 4, wherein the first layered structure comprises a plurality of first sub-layers, and the second layered structure comprises a plurality of second sub-layers, wherein the plurality of first sub-layers and the plurality of second sub-layers independently comprise a material comprising $MX_{n1}$, wherein:

M is a transition metal selected from the groups IVB, VB, or VIB of the periodic table, X is an element selected from a group consisting of sulfur, selenium, and tellurium, and n1 is in a range of 0.5-2.

11. The semiconductor structure of claim 4, wherein the first layered structure comprises a plurality of first sub-layers, and the second layered structure comprises a plurality of second sub-layers, wherein the plurality of first sub-layers and the plurality of second sub-layers independently comprise $Ta_{n2}S_{n3}$, wherein n2 is in a range of 1-2, and n3 is in a range of 2-5.

12. The semiconductor structure of claim 11, wherein the plurality of first sub-layers and the plurality of second sub-layers independently further comprise $TaO_2$.

13. A method of manufacturing a semiconductor structure, comprising:
providing a substrate having a semiconductor device; and
forming an interconnect over the substrate, the interconnect being electrically coupled to the semiconductor device, wherein forming the interconnect comprises:
disposing, over the substrate, a dielectric layer comprising an opening exposing a portion of the semiconductor device;
disposing, inside the opening formed in the dielectric layer over the substrate, a metallization layer comprising a via portion and a line portion connecting to the via portion;
forming a first capping material over the line portion of the metallization layer and the dielectric layer; and
performing a thermal treatment on the first capping material to form a first capping layer having a plurality of first sub-layers over the metallization layer, the first capping layer covering the line portion, and the line portion being sandwiched between the via portion and the first capping layer, wherein the first capping layer is further extended onto a surface of the dielectric layer.

14. The method of claim 13, wherein the thermal treatment is performed to form the first capping layer having a layered structure with the plurality of first sub-layers, wherein the plurality of first sub-layered are stacked on one another along a stacking direction of the substrate and the interconnect.

15. The method of claim 13, wherein prior to forming the metallization layer over the substrate, forming the interconnect further comprises:
forming a second capping material over the dielectric layer and the substrate, the second capping material extending into the opening; and
performing another thermal treatment on the second capping material to form a second capping layer having a plurality of second sub-layers over the dielectric layer and the portion of the semiconductor device,
wherein disposing the metallization layer inside the opening formed in the dielectric layer over the substrate comprises disposing the metallization layer on the second capping material over the substrate, the second capping layer being disposed between the metallization layer and the dielectric layer, and a sidewall and a bottom of the metallization layer being lined with the second capping layer.

16. The method of claim 15, wherein the another thermal treatment is performed to form the second capping layer having a layered structure with the plurality of second sub-layers, wherein the plurality of second sub-layered are stacked on one another along a stacking direction of the substrate and the interconnect, the metallization layer is enclosed by the first capping layer and the second capping layer.

17. The method of claim 15, wherein prior to forming the second capping layer and after disposing the dielectric layer, forming the interconnect further comprises:

forming a barrier layer on the dielectric layer, the barrier layer extending into the opening to be in contact with the portion of the semiconductor device, the barrier layer being interposed between the second capping layer and the dielectric layer, and the second capping layer being interposed between the barrier layer and the metallization layer.

18. The semiconductor structure of claim 1, wherein a surface of the dielectric layer is substantially coplanar with a surface of the line portion, and the capping layer completely covers the surface of the dielectric layer and the surface of the line portion of the metallization layer.

19. The semiconductor structure of claim 1, wherein a thickness of the capping layer is approximately ranging from 0.7 nm to 25 nm.

20. The semiconductor structure of claim 1, wherein a thickness of the capping layer is approximately ranging from 3.5 nm to 50 nm.

* * * * *